(12) United States Patent
Kariya et al.

(10) Patent No.: US 8,563,420 B2
(45) Date of Patent: Oct. 22, 2013

(54) MULTILAYER PRINTED WIRING BOARD

(75) Inventors: Takashi Kariya, Ibi-gun (JP); Akira Mochida, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 13/561,247

(22) Filed: Jul. 30, 2012

(65) Prior Publication Data

US 2012/0302010 A1    Nov. 29, 2012

Related U.S. Application Data

(60) Continuation of application No. 12/948,894, filed on Nov. 18, 2010, now Pat. No. 8,253,030, which is a division of application No. 12/419,007, filed on Apr. 6, 2009, now Pat. No. 8,124,882, which is a division of application No. 11/356,350, filed on Feb. 17, 2006, now Pat. No. 7,982,139, which is a continuation of application No. PCT/JP2004/018526, filed on Dec. 6, 2004.

(30) Foreign Application Priority Data

Dec. 5, 2003  (JP) ................................ 2003-407501
Dec. 3, 2004  (JP) ................................ 2004-350731

(51) Int. Cl.
 *H01L 21/4763*  (2006.01)
(52) U.S. Cl.
 USPC ........... 438/618; 438/104; 438/239; 438/240; 438/250; 438/393; 257/737; 257/738; 257/E21.505

(58) Field of Classification Search
 None
 See application file for complete search history.

(56) References Cited

U.S. PATENT DOCUMENTS

| | | | | |
|---|---|---|---|---|
| 4,500,942 A | * | 2/1985 | Wilson | 361/320 |
| 4,767,732 A | * | 8/1988 | Furukawa et al. | 501/137 |
| 4,929,295 A | * | 5/1990 | Kohno et al. | 156/230 |
| 5,016,137 A | * | 5/1991 | Yokotani et al. | 361/321.4 |
| 5,029,042 A | | 7/1991 | Dean | |
| 5,106,796 A | * | 4/1992 | Drozdyk et al. | 501/137 |
| 5,161,086 A | | 11/1992 | Howard et al. | |

(Continued)

FOREIGN PATENT DOCUMENTS

| | | |
|---|---|---|
| EP | 1 419 528 B1 | 10/2006 |
| JP | 5-36857 | 2/1993 |

(Continued)

*Primary Examiner* — Zandra Smith
*Assistant Examiner* — Khanh Duong
(74) *Attorney, Agent, or Firm* — Oblon, Spivak, McClelland, Maier & Neustadt, L.L.P.

(57) ABSTRACT

A method for manufacturing a printed wiring board includes forming an uncalcined layer containing a raw ceramic material on a first metal layer, firing the uncalcined layer formed on the first metal layer such that a high dielectric constant layer having a ceramic body calcined in a sheet form is formed on the first metal layer, forming a second metal layer on the high dielectric constant layer on the opposite side of the high dielectric constant layer with respect to the first metal layer such that a layered capacitor having the high dielectric constant layer and first and second layer electrodes sandwiching the high dielectric constant layer is formed, and disposing the layered capacitor in a main body.

20 Claims, 17 Drawing Sheets

(56) References Cited

U.S. PATENT DOCUMENTS

| | | |
|---|---|---|
| 5,177,670 A | 1/1993 | Shinohara et al. |
| 5,610,565 A * | 3/1997 | Maeda et al. .................. 333/185 |
| 5,614,044 A * | 3/1997 | Nagayama et al. ........ 156/89.12 |
| 6,068,782 A | 5/2000 | Brandt et al. |
| 6,447,888 B2 | 9/2002 | Suzuki et al. |
| 6,541,137 B1 | 4/2003 | Kingon et al. |
| 6,608,760 B2 | 8/2003 | Hartman et al. |
| 6,815,085 B2 | 11/2004 | Appelt et al. |
| 6,970,362 B1 | 11/2005 | Chakravorty |
| 2002/0011662 A1 | 1/2002 | Komiya et al. |
| 2002/0180063 A1 | 12/2002 | Iwaki et al. |
| 2003/0063453 A1 | 4/2003 | Kusagaya et al. |
| 2003/0202314 A1 | 10/2003 | Appelt et al. |
| 2004/0099999 A1 | 5/2004 | Borland |

FOREIGN PATENT DOCUMENTS

| | | |
|---|---|---|
| JP | 11-260148 | 9/1999 |
| JP | 2000-208945 | 7/2000 |
| JP | 2001-36253 | 2/2001 |
| JP | 2001-044591 | 2/2001 |
| JP | 2001-068858 | 3/2001 |
| JP | 2001-298272 | 10/2001 |
| JP | 2001-326293 | 11/2001 |
| JP | 2001-352141 | 12/2001 |
| JP | 2002-164660 | 6/2002 |
| TW | 593207 | 6/2004 |
| WO | WO 03/019656 A2 | 3/2003 |

* cited by examiner (a)

(b)

(c)

MULTILAYER PRINTED WIRING BOARD

CROSS-REFERENCE TO RELATED APPLICATIONS

This application is a continuation of and claims the benefit of priority under 35 U.S.C. §120 from U.S. Ser. No. 12/948,894, filed Nov. 18, 2010, which is a divisional of and claims the benefit of priority under 35 U.S.C. §120 from U.S. Ser. No. 12/419,007, filed Apr. 6, 2009, which is a divisional of and claims the benefit of priority under 35 U.S.C. §120 from U.S. Ser. No. 11/356,350, filed Feb. 17, 2006, the contents of each of which are incorporated by reference herein in their entirety. U.S. application Ser. No. 11/356,350 is a continuation of International Application No. PCT/JP2004/018526, filed Dec. 6, 2004, and claims the benefit of priority under 35 U.S.C. §119 from Japanese Patent Application Nos. 2003-407501, filed Dec. 5, 2003 and 2004-350731, filed Dec. 3, 2004. The contents of Japanese Patent Application Nos. 2003-407501 and 2004-350731 are also incorporated by reference herein in their entirety.

BACKGROUND ART

1. Field of the Invention

This invention concerns a multilayer printed wiring board having build-up portions, in which wiring patterns, laminated in plural layers via insulating layers, are electrically connected to each other by means of via holes in the insulating layers.

2. Description of the Prior Art

Various structures have been proposed for multilayer printed wiring boards having build-up portions. In the build-up portions of the proposed multilayer printed boards, wiring patterns, laminated in plural layers via insulating layers, are electrically connected to each other by means of via holes in the insulating layers. In this type of multilayer printed wiring board, the potential of the power supply line may drop instantaneously due to switching noise when a mounted semiconductor element is switched on and off at a high speed. In order to restrain such instantaneous potential drops, decoupling by connection of a capacitor portion between the power supply line and the ground line has been proposed. As a capacitor portion for this purpose, JP-A 2001-68858 proposes the provision of a layered capacitor portion inside a multilayer printed wiring board.

SUMMARY OF THE INVENTION

The present invention provides a multilayer printed wiring board having build-up portions in which multiple wiring patterns are laminated in layers via insulating layers and are electrically connected to each other by means of via holes formed in the insulating layers. The multilayer printed wiring board includes: a mounting portion, on the surface of which is mounted a semiconductor element that is electrically connected to the above-described wiring patterns; and a layered capacitor portion that is disposed between the mounting portion and the build-up portion and includes a high dielectric constant layer formed of ceramic and first and second layer electrodes sandwiching the high dielectric constant layer, where one of either of the first and second layer electrodes is connected to a power supply line of the above-described semiconductor element and the other of either of the above-described first and second layer electrodes is connected to a ground line.

In this multilayer printed wiring board, the high dielectric constant layer of the layered capacitor portion, which is connected between the power supply line and the ground line, is formed of ceramic. In this structure, the dielectric constant and the static capacitance can be high, compared with those in the conventional arrangement that uses an organic resin blended with inorganic filler. Therefore, an adequate decoupling effect is exhibited even when the on/off frequency of the semiconductor element is high and in the range of several GHz to several dozen GHz (for example, 3 GHz to 20 GHz).

In the multilayer printed wiring board of the invention, the high dielectric constant layer that is preferably prepared by calcining a high dielectric constant material apart from the build-up portion, and is joined to the build-up portion. A build-up portion is generally prepared under a temperature condition of not more than 200° C., and it is difficult to calcine and make a high dielectric constant material into a ceramic. Therefore the high dielectric constant material is preferably calcined and made into a ceramic apart from the build-up portion. The high dielectric constant layer is not restricted in particular, but is preferably prepared by calcining, for example, a raw material containing one type or two or more types of metal oxide selected from the group consisting of: barium titanate ($BaTiO_3$), strontium titanate ($SrTiO_3$), tantalum oxide ($TaO_3$, $Ta_2O_5$), lead zirconate titanate (PZT), lead lanthanum zirconate titanate (PLZT), lead niobium zirconate titanate (PNZT), lead calcium zirconate titanate (PCZT), and lead strontium zirconate titanate (PSZT).

In the multilayer printed wiring board of the invention, the first layer electrode may have a solid pattern having passage holes, through which rod terminals connected to the second layer electrode pass in a non-contacting manner, at the lower surface side of the high dielectric constant layer, and the second layer electrode may have a solid pattern having passage holes, through which rod terminals connected to the first layer electrode, pass in a non-contacting manner, at the upper surface side of the high dielectric constant layer. With this arrangement, since the areas of the first and second layer electrodes of the layered capacitor portion can be large, the static capacitance of the layered capacitor portion can be high. Also, since the layered capacitor portion can be charged with charges via a short wiring length from an external power supply source and power can be supplied to the semiconductor element via a short wiring length from the layered capacitor portion, an adequate decoupling effect can be provided and inadequacy of power supply will be unlikely to occur even with a semiconductor element with a short on/off interval of several GHz to several dozen GHz (for example, 3 GHz to 20 GHz). Each of the solid patterns may be provided at a portion or across the entirety of the upper surface or the lower surface of the high dielectric constant layer.

In the printed wiring board of the invention, the mounting portion may have a plurality of pads connected to the electrodes of the semiconductor element, and the number of rod terminals that are electrically connected to pads of the same potential as the first layer electrode and passing through the second layer electrode in a non-contacting manner may be less than the number of pads of the same potential as the first layer electrode. The number of passage holes, through which the rod terminals that are connected to the pads of the same potential as the first layer electrode and pass through the second layer electrode in a non-contacting manner, is lessened. Thus, the area of the second layer electrode can be large and the static capacitance of the layered capacitor portion can be high.

In the printed wiring board of the invention, the mounting portion may have a plurality of pads connected to the electrodes of the semiconductor element, and the number of rod terminals, which are electrically connected to pads of the same potential as the second layer electrode and passing through the first layer electrode in a non-contacting manner, may be less than the number of pads of the same potential as the second layer electrode. The number of passage holes, through which the rod terminals that are connected to the pads of the same potential as the second layer electrode and pass the first layer electrode in a non-contacting manner, is lessened. Thus, the area of the first layer electrode can be large and the static capacitance of the layered capacitor portion can be high. Here, the rod terminals connected to pads of the same potential as the second layer electrode may pass not just through the first layer electrode but also through the second layer electrode in a non-contacting manner.

A portion of the above-described two types of rod terminals (that is, the rod terminals that are connected to the pads of the same potential as the first layer electrode and passing through the second layer electrode in a non-contacting manner, and the rod terminals that are connected to the pads of the same potential as the second layer electrode and passing through the first layer electrode in a non-contacting manner) may be aligned at least partially alternatingly in a lattice-like or zigzag manner. With this arrangement, the loop inductance is made low and instantaneous drops of the power supply potential can be prevented more readily.

In one modified structure of the multilayer printed wiring board of the invention, the mounting portion may have first pads that are connected to one of either of a power supply electrode and a ground electrode of the semiconductor element, and second pads that are connected to the other electrode. In this structure, some of the first pads have a first rod terminal which passes through the second layer electrode in a non-contacting manner, and are electrically connected via the first rod terminal to the first layer electrode and one of the electrodes of an external power supply, while the others of the first pads do not have the first rod terminal in themselves and are electrically connected to the first pads having the first rod terminal. Some of the second pads have a second rod terminal which passes through the first layer electrode in a non-contacting manner, and are electrically connected via the second rod terminal to the second layer electrode and the other electrode of the external power supply, while the others of the second pads do not have the second rod terminal in themselves and are electrically connected to the second pads having the second rod terminal. With this arrangement, the number of the first rod terminals and the second rod terminals can be restricted and the number of passage holes, through which these rod terminals pass the first layer electrode and the second layer electrode, is lessened. Thus, the areas of the first and second layer electrodes can be large and the static capacitance of the layered capacitor portion can be high. It is possible, for example, to arrange the first and second layer electrodes as substantially solid patterns. Also, with this arrangement, the layered capacitor portion can be charged with charges via a short wiring length from an external power supply source and power can be supplied to the semiconductor element via a short wiring length from the layered capacitor portion. Thus, an adequate decoupling effect can be provided and inadequacy of power supply will be unlikely to occur even with a semiconductor element with a short on/off interval of several GHz to several dozen GHz (for example, 3 GHz to 20 GHz).

In another modified structure of the multilayer printed wiring board of the invention, the mounting portion may have first pads that are connected to one of either of a power supply electrode and a ground electrode of the semiconductor element, and second pads that are connected to the other electrode. In this structure, some of the first pads have a first rod terminal which passes through the second layer electrode in a non-contacting manner, and are electrically connected via the first rod terminal to the first layer electrode and one of the electrodes of an external power supply, while the others of the first pads do not have the first rod terminal in themselves and are electrically connected to the first pads having the first rod terminal. Some of the second pads have a second rod terminal, which passes through both the first layer electrode and the second layer electrode in a non-contacting manner, and are connected via the second rod terminal to the other electrode of the external power supply and the others of the second pads do not have the second rod terminal in themselves and are electrically connected to at least one of either of the second layer electrode and the second pads having the second rod terminal. With this arrangement, the number of the first rod terminals and the second rod terminals can be restricted and the number of passage holes, through which these rod terminals pass the first layer electrode and the second layer electrode, is lessened. Thus, the areas of the first and second layer electrodes can be large and the static capacitance of the layered capacitor portion can be high. It is possible for example, to arrange the first and second layer electrodes as substantially solid patterns. Also, with this arrangement, the layered capacitor portion can be charged with charges via a short wiring length from an external power supply source and power can be supplied to the semiconductor element via a short wiring length from the layered capacitor portion. Thus, an adequate decoupling effect can be provided and inadequacy of power supply will be unlikely to occur even with a semiconductor element with a short on/off interval of several GHz to several dozen GHz (for example, 3 GHz to 20 GHz).

In the multilayer printed wiring board with the above structures where the first rod terminals and the second rod terminals are provided, at least a portion of the first rod terminals and the second rod terminals may be aligned alternatingly in a lattice-like or zigzag manner. With this arrangement, the loop inductance is made low, and instantaneous drops of the power supply potential can be prevented more readily.

In the multilayer printed wiring board of the invention, the distance between the first and second layer electrodes may be set to not more than 10 μm so that a short will practically not occur in the layered capacitor portion. With this arrangement, the distance between electrodes of the layered capacitor portion is adequately small, and the static capacitance of this layered capacitor portion can be high.

In the multilayer printed wiring board of the invention, the capacitor portion is preferably formed below the semiconductor element mounted on the mounting portion. With this arrangement, power can be supplied to the semiconductor element via the minimum wiring length.

The multilayer printed wiring board may have a chip capacitor installed at the top surface side at which the mounting portion is disposed and is connected to the first and second layer electrodes. In the case where the static capacitance is inadequate with just the layered capacitor portion, the inadequacy can be supplemented by the chip capacitor. Though the decoupling effect degrades the longer the wiring between the chip capacitor and the semiconductor element, the wiring to the semiconductor element can be short and the degradation of the decoupling effect can be restrained in this arrangement because the chip capacitor is installed at the top surface side where the mounting portion is disposed. Also, the power loss from the chip capacitor to the semiconductor element is made small in this arrangement because the chip capacitor and the semiconductor element are connected via the layered capacitor portion.

The multilayer printed wiring board of the invention may have a stress relaxing portion formed of an elastic material and disposed between the mounting portion and the layered capacitor portion. In this structure, even if stress occurs due to a thermal expansion difference between the semiconductor element mounted on the mounting portion and the layered capacitor portion or the build-up portion, the stress relaxing portion absorbs the stress. Thus, the reliability of connection, the reliability of insulation, etc., will thus not readily lowered. Also, though the high dielectric constant layer of the layered capacitor portion is thin, brittle, and thus tends to crack readily, the forming of cracks can be prevented by the presence of the stress relaxing portion. Here, the stress relaxing portion may be formed just below the semiconductor element that is mounted on the above-described mounting portion. Since stress due to a thermal expansion difference mainly becomes a problem below the semiconductor element, the material cost can be held down by forming the stress relaxing portion below the semiconductor element. The material of such a stress relaxing portion is not restricted in particular, but may be a modified epoxy based resin sheet, a polyphenylene ether based resin sheet, a polyimide based resin sheet, a cyanoester based resin sheet, an imide based resin sheet, and other organic base resin sheets. Such an organic based resin sheet may contain a thermoplastic resin, such as a polyolefin based resin or a polyimide based resin, a thermosetting resin, such as silicone resin, or a rubber based resin, such as SBR, NBR, urethane, etc., and may contain a fibrous, filler, or flattened inorganic based material of silica, alumina, zirconia, etc. The stress relaxing portion preferably has a Young's modulus in a range of 10 to 1000 MPa. When stress occurs due to a thermal expansion coefficient difference between the semiconductor element mounted on the mounting portion and the layered capacitor portion, the stress relaxing portion within this range can adequately relax the stress.

BEST MODE FOR CARRYING OUT THE INVENTION

Example 1

Figure 1:
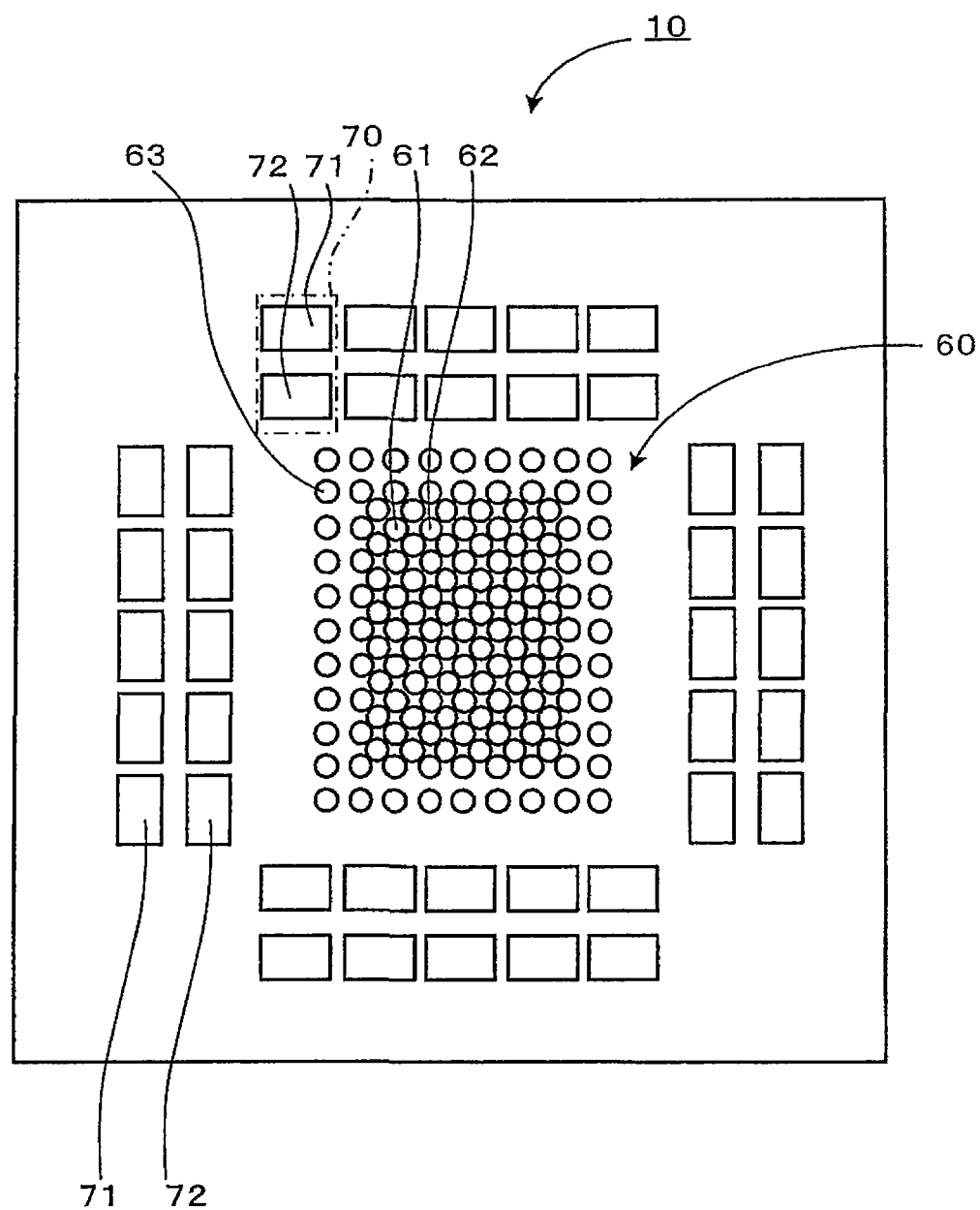
FIG. 1 is a plan view of a multilayer printed wiring board 10 of an Example 1.
Figure 2:
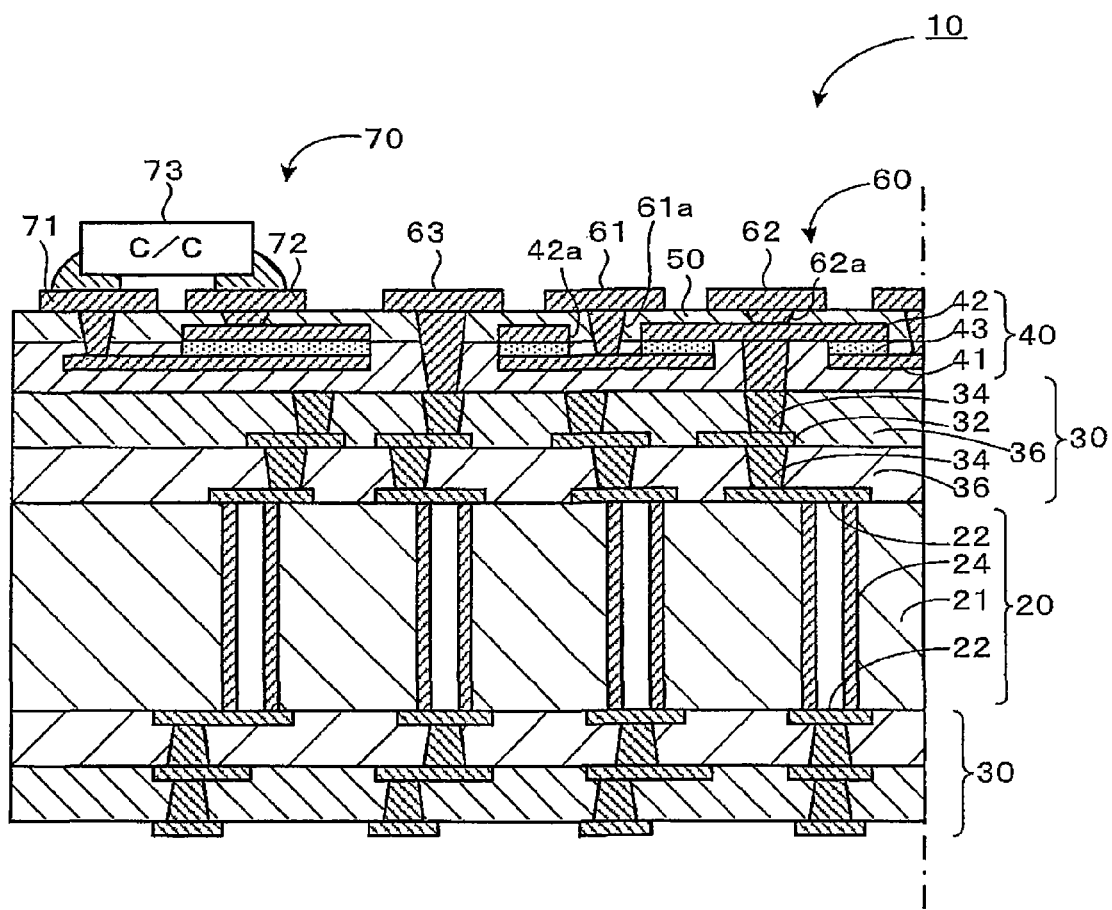
FIG. 2 is a longitudinal section (showing only the left side of a central line) of the multilayer printed wiring board 10.
Figure 3:
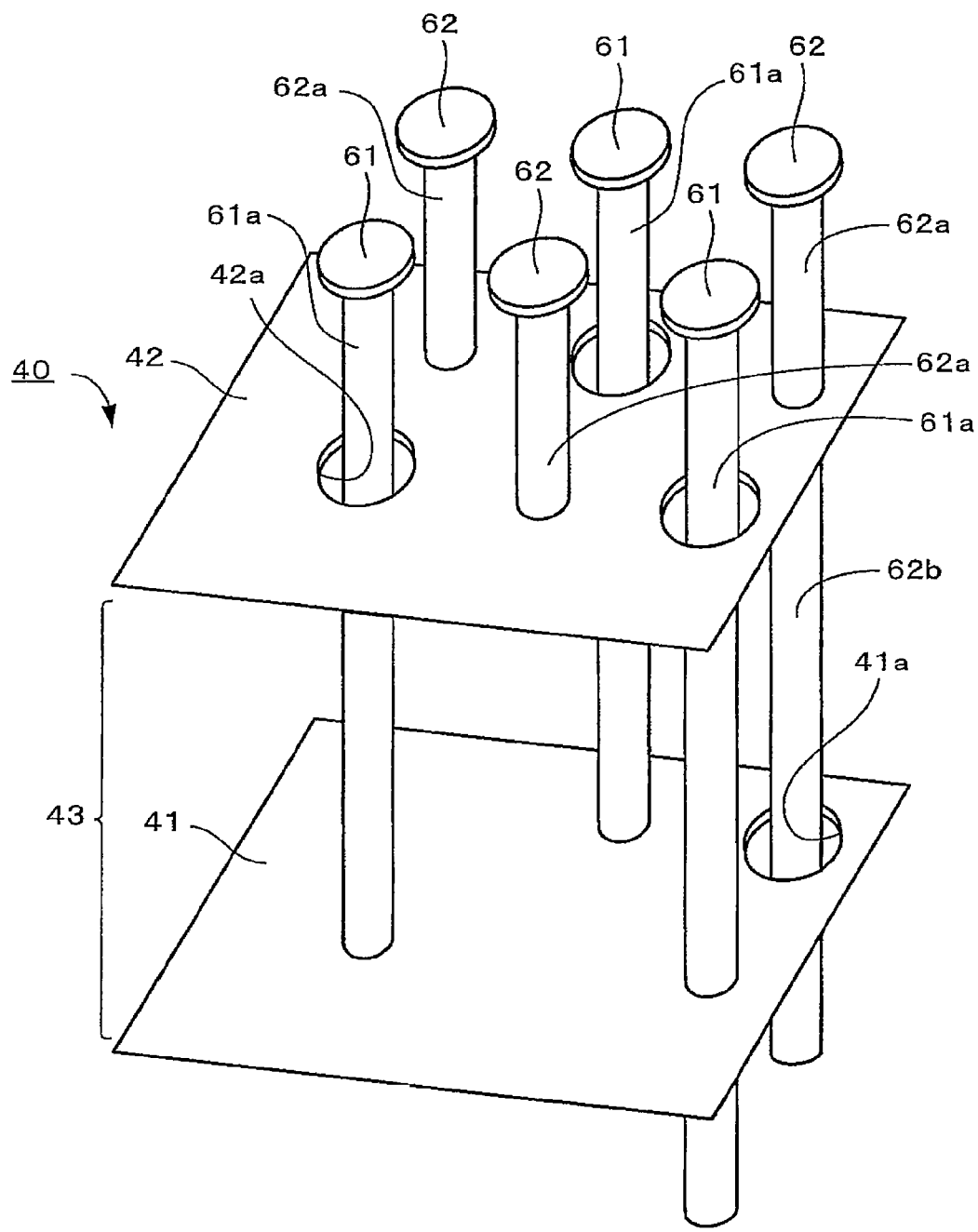
FIG. 3 is a schematic perspective view of a layered capacitor portion 40.
Figure 4:
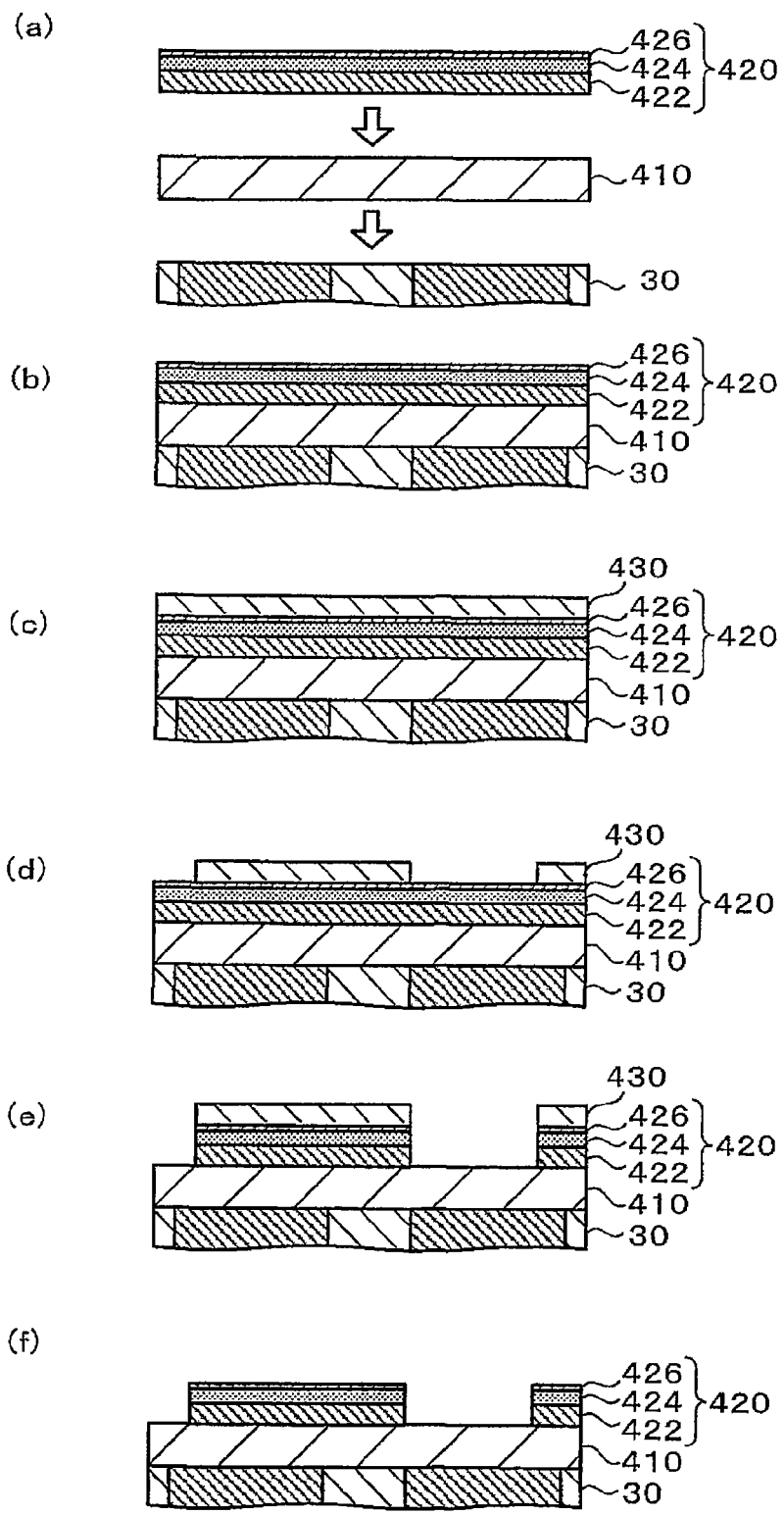
FIG. 4 is an explanatory diagram of a process for manufacturing the multilayer printed wiring board 10.
Figure 5:
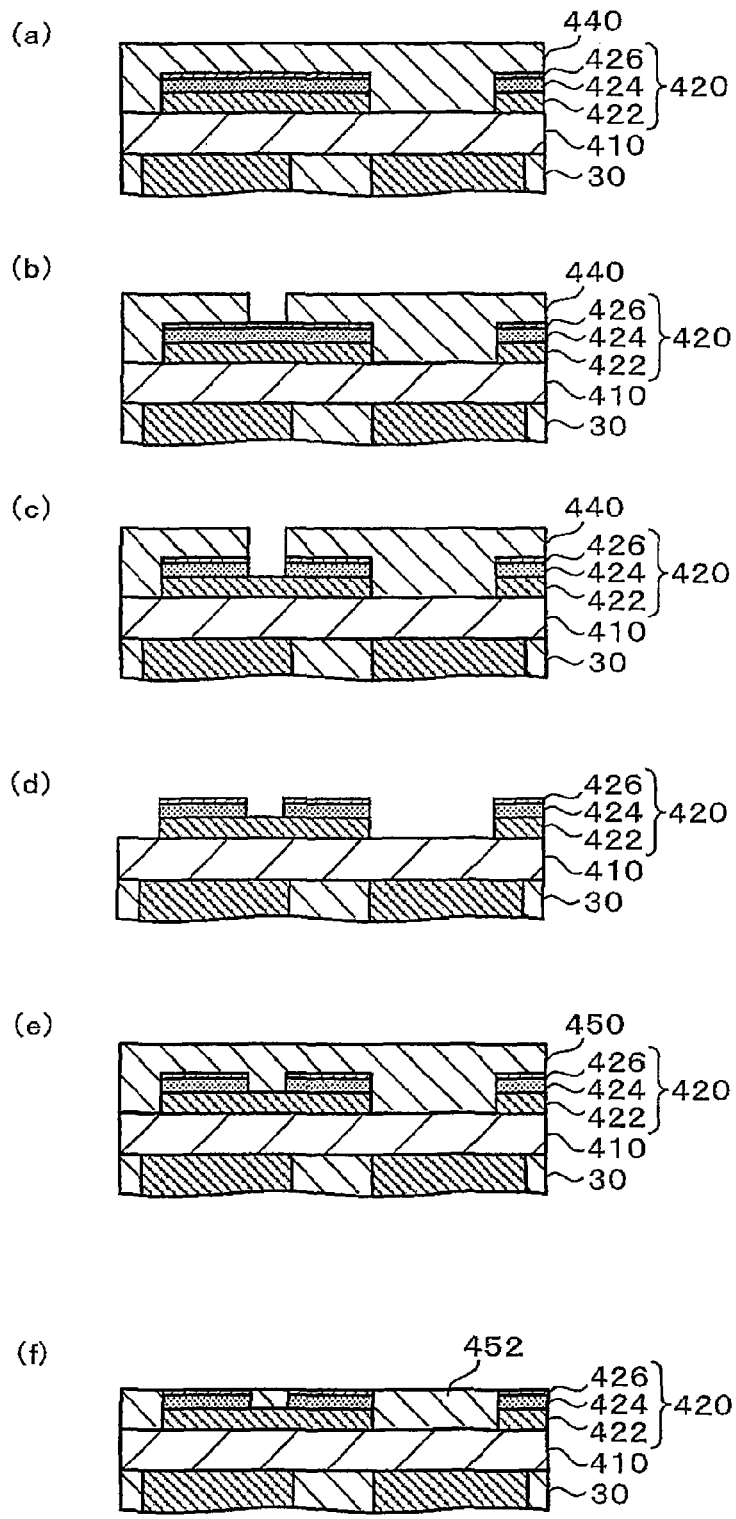
FIG. 5 is an explanatory diagram of a process for manufacturing the multilayer printed wiring board 10.
Figure 6:
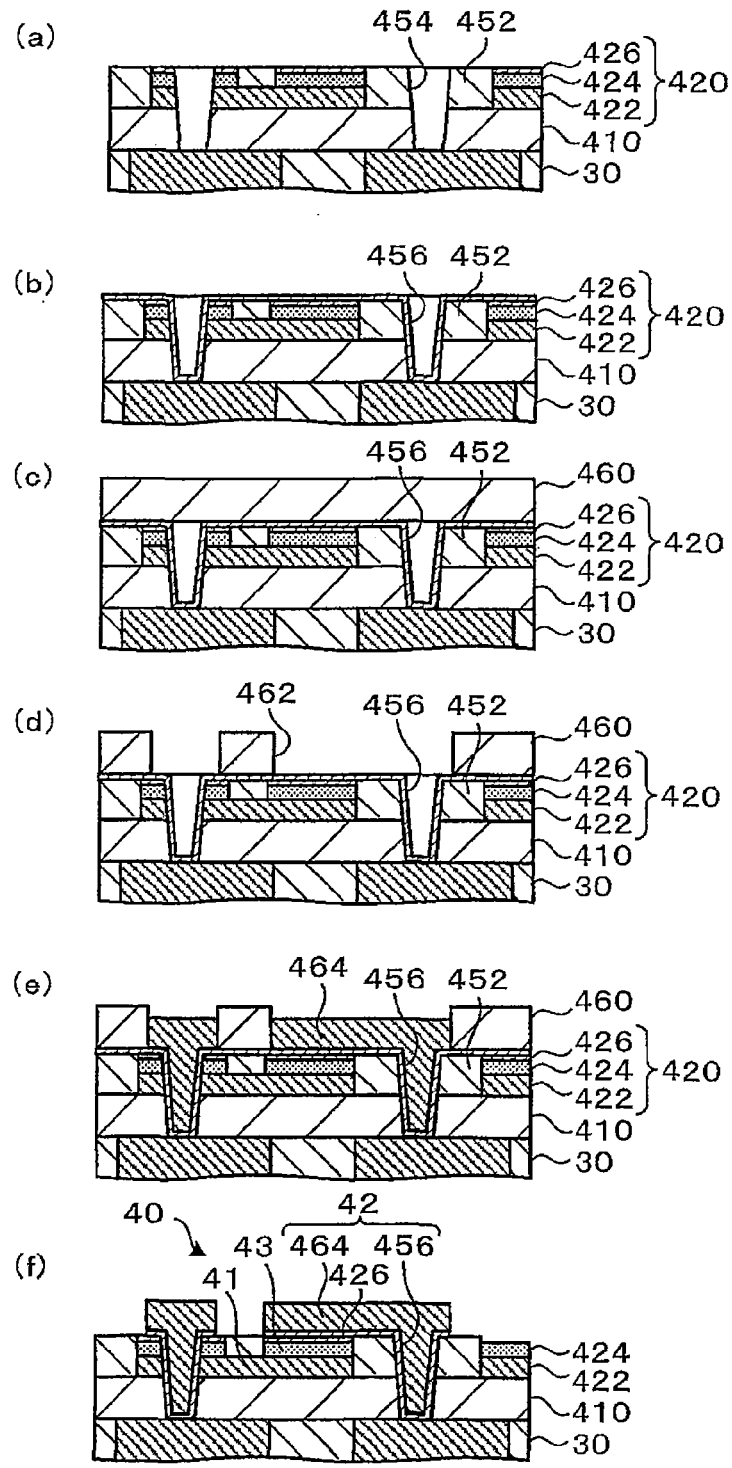
FIG. 6 is an explanatory diagram of a process for manufacturing the multilayer printed wiring board 10.
Figure 7:
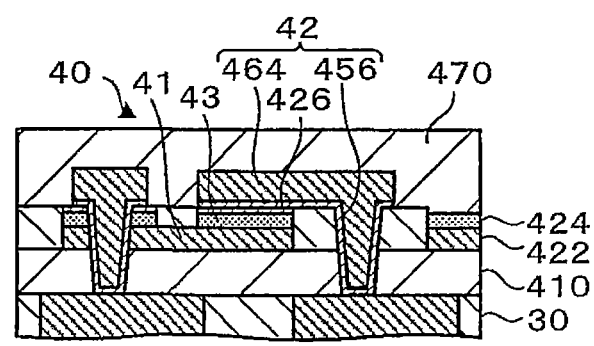
FIG. 7 is an explanatory diagram of a process for manufacturing the multilayer printed wiring board 10.
Figure 7:
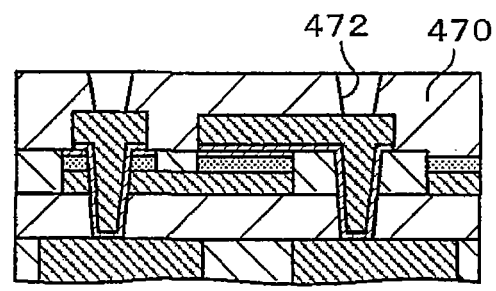
Figure 7:
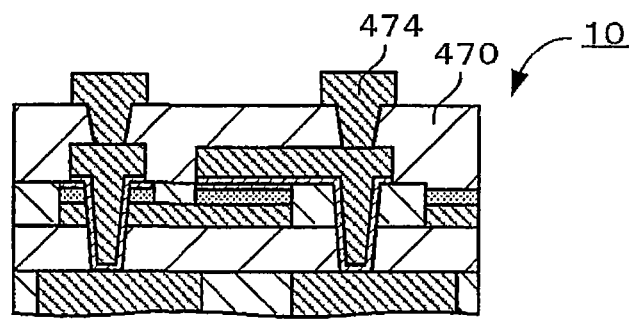

Embodiments of this invention shall now be described with reference to the drawings. FIG. 1 is a plan view of a multilayer printed wiring board 10, which is an example of this invention, FIG. 2 is a longitudinal section (showing only the left side of the central line) of multilayer printed wiring board 10, and FIG. 3 is a schematic perspective view of a layered capacitor portion 40. As shown in FIG. 2, the multilayer printed wiring board 10 of the present example includes a core substrate 20, a build-up portion 30 on the core substrate 20, and a layered capacitor portion 40. In the core substrate 20, wiring patterns 22 that are formed on the top and back surfaces are electrically connected to each other via through hole conductors 24. In the build-up portion 30, wiring patterns 32 and 22, which are laminated in plural layers via resin insulating layers 36 on the upper surface of the core substrate 20, are electrically connected to each other by means of via holes 34. The layered capacitor portion 40 includes a high dielectric constant layer 43 and first and second layer electrodes 41 and 42 that sandwich the high dielectric constant layer 43. The multilayer printed wiring board 10 further includes a stress relaxing portion 50 formed of an elastic material, a mounting portion 60 on which a semiconductor element is mounted, and chip capacitor positioning regions 70 disposed at the periphery of the mounting portion 60.

The core substrate 20 has wiring patterns 22 formed of copper at both the top and back surfaces of a core substrate main body 21 formed of BT (bismaleimide-triazine) resin or a glass epoxy substrate, etc., and through hole conductors 24 formed of copper on inner peripheral surfaces of through holes that pass through from the top to back of the core substrate main body 21. The wiring patterns 22 at the respective surfaces are electrically connected via through hole conductors 24.

The build-up portions 30 are formed by layering resin insulating layers 36 and wiring patterns 32 alternatingly on the top and back surfaces of the core substrate 20, and the respective wiring patterns 32 are electrically connected through via holes 34 that pass through from the top to back of insulating resin layers 36. Such build-up portions 30 are formed by any of known subtractive methods and additive methods (including semi-additive methods and full additive methods) and are, for example, formed as follows. First, resin sheets, which are to become resin insulating layers 36, are adhered respectively onto the top and back surfaces of the core substrate 20. Here, the Young's modulus at room temperature of each resin insulating layer 36 is 2 to 7 GPa. Each resin sheet is formed of a modified epoxy based sheet, a polyphenylene ether based resin sheet, a polyimide based resin sheet, or a cyanoester based resin sheet, etc., and the thickness thereof is approximately 20 to 80 µm. This resin sheet may have silica, alumina, zirconia, or other inorganic component dispersed therein. Each adhered resin sheet is then made into a resin insulating layer 36 by forming through holes therein by means of a carbon dioxide gas laser, UV laser, YAG laser, excimer laser, etc., and the surface of the resin insulating layer 36 and the interior of the through holes are subject to electroless copper plating and made into a conductive layer. A plating resist is then formed on the conductive layer and after subjecting the portions at which the plating resist is not formed to electrolytic copper plating, the electroless copper plating below the resist is removed by an etching solution to form wiring pattern 32. The conductive layers at the interiors of the through holes become via holes 34. This procedure is then repeated to form build-up portions 30.

The layered capacitor portion 40 includes high dielectric constant layer 43 formed by calcining a ceramic-based high dielectric constant material at a high temperature, and first layer electrode 41 and second layer electrode 42 that sandwich the high dielectric constant layer 43. Of these layered capacitor portion 40, the first layer electrode 41 is a copper electrode that is electrically connected to ground pads 61 of the mounting portion 60, and the second layer electrode 42 is a copper electrode that is electrically connected to the power supply pads 62 of the mounting portion 60. The first and second layer electrodes 41 and 42 are thus respectively connected to a ground line and a power supply line of the semiconductor element mounted on the mounting portion. The first layer electrode 41 is a solid pattern formed on the lower surface of high dielectric constant layer 43 and has passage holes 41a, through which via holes 62b connected to power supply pads 62 pass in a non-contacting manner. Though the respective power supply pads 62 are connected to the second layer electrode 42 through via holes 62a, via holes 62b are disposed in correspondence to a portion of via holes 62a. This is because the respective via holes 62a are connected to the second layer electrode 42 and thus as long as there is at least one via hole 62b that extends downwards from the second layer electrode 42, connection to the ground line can be achieved through that via hole 62b. The second layer electrode 42 is a solid pattern formed on the upper surface of high dielectric constant layer 43 and has passage holes 42a, through which via holes 61a connected to ground pads 61 pass in a non-contacting manner. The distance between the first and second layer electrodes 41 and 42 is set to a distance that is not more than 10 μm and yet with which shorting practically does not occur. The high dielectric constant layer 43 is formed by making a high dielectric constant material, containing one or two or more types of metal oxide selected from the group consisting of $BaTiO_3$, $SrTiO_3$, $TaO_3$, $Ta_2O_5$, PZT, PLZT, PNZT, PCZT, and PSZT, into a thin film of 0.1 to 10 μm and thereafter calcining and making the high dielectric constant material into a ceramic. The details of a process for manufacturing the layered capacitor portion 40 shall be described later.

Though partially overlapping with the description above, the layered capacitor portion 40 shall now be described in more detail. In the layered capacitor portion 40, the first layer electrode 41 is electrically connected through via holes 61a to ground pads 61 of the mounting portion 60 and the second layer electrode 42 is electrically connected through via holes 62a to power supply pads 62 of the mounting portion 60. The first and second layer electrodes 41 and 42 are thus connected to the ground line and the power supply line, respectively of the semiconductor element mounted on the mounting portion 60. The first layer electrode 41 is a solid pattern formed on the lower surface of the high dielectric constant layer 43 and has passage holes 41a, through which via holes 62b connected to the second layer electrode 42 pass in a non-contacting manner. Though via holes 62b may be provided in correspondence to all power supply pads 62, here, via holes 62b are provided in correspondence to a portion of power supply pads 62. This is because the second layer electrode 42 is connected through the respective via holes 62a to the respective power supply pads 62 and thus as long as there is at least one via hole 62b that extends downwards from the second layer electrode 42, all power supply pads 62 can be connected to an external power supply line through that via hole 62b. By thus providing via holes 62b in correspondence to a portion of power supply pads 62, the number of passage holes 41a to be provided in the first layer electrode 41 can be small and since the area of the first layer electrode 41 can be large, so that the static capacitance of layered capacitor portion 40 can be high. The positions at which passage holes 41a are to be formed are determined depending on the static capacitance of layered capacitor portion 40, the positioning of via holes 62a, etc. The second layer electrode is a solid pattern formed on the upper surface of high dielectric constant layer 43 and has passage holes 42a, through which via holes 61a connected to ground pads 61 pass in a non-contacting manner. Though passage holes 42a may be provided in correspondence to all ground pads 61, here, a plurality of ground pads 61 are connected together at the upper side of the second layer electrode 42 and via holes 61a are formed for just a portion of these ground pads 61 and are made to pass through passage holes 42a of the second layer electrode 42 in a non-contacting manner. By thus providing via holes 61a in correspondence to a portion of ground pads 61, the number of passage holes 42a to be provided in the second layer electrode 42 can be small and since the area of the second layer electrode 42 can be large, so that the static capacitance of layered capacitor portion 40 can be high. The positions at which passage holes 42a are to be formed are determined depending on the static capacitance of the layered capacitor portion 40, the positioning of via holes 62a, etc.

The stress relaxing portion 50 is formed of an elastic material. The elastic material is not restricted in particular, but may be a modified epoxy based resin sheet, a polyphenylene ether based resin sheet, a polyimide based resin sheet, a cyanoester based resin sheet, an imide based resin sheet, and other organic base resin sheets can be cited as examples. Such an organic based resin sheet may contain a thermoplastic resin, such as a polyolefin based resin or a polyimide based resin, a thermosetting resin, such as silicone resin, or a rubber based resin, such as SBR, NBR, urethane, etc., and may contain a fibrous, filler, or flattened inorganic based material of silica, alumina, zirconia, etc. The stress relaxing portion 50 preferably has a low Young's modulus of 10 to 1000 MPa. When stress occurs due to a thermal expansion coefficient difference between the semiconductor element mounted to the mounting portion 50, and the layered capacitor portion, the Young's modulus of the stress relaxing portion 50 within this range can adequately relax the stress.

The mounting portion 60 is the region on which the semiconductor element is mounted and is formed on the top surface of the multilayer printed wiring board 10. On this mounting portion 60, ground pads 61, power supply pads 62, and signal pads 63 are aligned in a lattice-like or zigzag manner (see FIG. 1). Ground pads 61 and power supply pads 62 may be aligned in a lattice-like or zigzag manner near the center and signal pads 63 may be aligned in a lattice-like manner, a zigzag manner, or randomly in the periphery. Ground pads 61 and power supply pads 62 are preferably aligned alternatingly. The number of terminals of the mounting portion 60 is 1000 to 300000. A plurality of the chip capacitor positioning regions (see FIG. 1) are formed in the periphery of the mounting portion 60. A plurality of pairs of the ground pad 71 and power supply pad 72 are formed in the chip capacitor positioning regions 70 so as to be connected with the ground terminals and power supply terminals, respectively, of the chip capacitors 73. The respective ground pads 71 are connected via first layer electrode 41 of the layered capacitor portion 40 to the negative electrode of an external power supply and the respective power supply pads 72 are connected via the second layer electrode 42 to the positive electrode of the external power supply.

An example of use of the multilayer printed wiring board 10 described above shall now be described. First, the power supply terminal and the ground terminal of a chip capacitor 73 are joined by soldering to the ground pad 71 and power supply pad 72, respectively, of a chip capacitor positioning region 70. A semiconductor element having a plurality of solder bumps aligned on the back surface is then set on the mounting portion 60. In this process, the ground terminals, the power supply terminals, and the signal terminals of the semiconductor element are put in contact with ground pads 61, power supply pads 62, and signal pads 63, respectively of the mounting portion 60. The respective terminals are then joined by soldering by the reflow method. Then, the multilayer printed wiring board 10 is joined by soldering to another printed wiring board of the mother board. In this process, solder bumps are formed in advance on the pads formed on the back surface of the multilayer printed wiring board 10 and then joined by reflow in a state of contacting corresponding pads of another printed wiring board.

Procedures for manufacturing multilayer printed wiring board 10 of the present example shall now be described. Since the procedures for preparing the core substrate 20 and the build-up portion 30 are well known, the description here shall mainly concern the procedures for preparing the layered capacitor portion 40 and the stress relaxing portion 50. FIGS. 4 to 7 are explanatory diagrams of these procedures.

First, as shown in FIG. 4A, the core substrate 20 having the build-up portion 30 formed at least on one surface was prepared. An interlayer insulating layer 410 was adhered onto the build-up portion 30 using a vacuum laminator, under lamination conditions of a temperature of 50 to 150° C. and a pressure of 0.5 to 1.5 MPa. A high dielectric constant sheet 420, which had been prepared in advance, was then adhered onto the interlayer insulating layer 410 under lamination conditions of a temperature of 50 to 150° C. and a pressure of 0.5 to 1.5 MPa using a vacuum laminator and then cured for three hours at 150° C. (see FIG. 4B). Here, high dielectric constant sheet 420 is prepared as follows. That is, a high dielectric constant material, containing one or two or more types of metal oxide selected from the group consisting of $BaTiO_3$, $SrTiO_3$, $TaO_3$, $Ta_2O_5$, PZT, PLZT, PNZT, PCZT, and PSZT, is printed in the form of a thin film of 0.1 to 10 μm thickness onto a copper foil 422 (to subsequently become the first layer electrode 41) of 12 μm thickness using a roll coater, doctor blade, or other printing device and thereby made into an uncalcined layer. After printing, this uncalcined layer is calcined in vacuum or under a non-oxidizing atmosphere of $N_2$ gas, etc. at a temperature range of 600 to 950° C. and made into a high dielectric constant layer 424. Thereafter, a metal layer of copper, platinum, or gold, etc., is formed on the high dielectric constant layer 424 using a sputterer or other vacuum vapor deposition device and by adding approximately 10 μm of copper, nickel, tin, or other metal by electrolytic plating, etc., onto this metal layer, an upper metal layer 426 (subsequently forming a portion of the second layer electrode 42) is formed. High dielectric constant sheet 420 can be thus obtained.

A commercially available dry film 430 was then adhered onto the substrate with the high dielectric constant sheet 420 laminated thereon (see FIG. 4C), and pattern forming of the high dielectric constant sheet 420 was then performed by carrying out exposure and development (see FIG. 4D), etching (see FIG. 4E), and film removal (see FIG. 4F), which are normally carried out in the pattern forming of a multilayer printed wiring board. In the etching process, a cupric chloride etching solution was used.

A dry film 440 was then adhered again onto the substrate in the middle of preparation on which pattern forming of the high dielectric constant sheet 420 had been performed (see FIG. 5A), and pattern forming of the metal layer 426 and high dielectric constant layer 424 on the high dielectric constant sheet 420 was then performed by carrying out exposure and development (see FIG. 5B), etching (see FIG. 5C), and film removal (see FIG. 5D). Though a cupric chloride etching solution was used in the etching process, the process was carried out in a short time so that after the etching metal layer 426 and the high dielectric layer 424, the copper foil 422 was etched only slightly.

The substrate in the middle of preparation, with which pattern forming of the metal layer 426 and high dielectric constant layer 424 had been performed, was then filled with an interlayer filling resin 450 using a squeegee (see FIG. 5E) and dried for 20 minutes at 100° C. Here, the interlayer filling resin 450 was prepared by placing 100 weight parts of bisphenol F epoxy monomer (trade name: YL983U; made by Yuka Shell Epoxy Co., Ltd.; molecular weight: 310), 72 weight parts of spherical $SiO_2$ particles of an average particle diameter of 1.6 μm, a maximum particle diameter of not more than 15 μm, and having a silane coupling agent coated on the surface (trade name: CRS1101-CE; made by Adtec Co., Ltd.), and 1.5 weight parts of a leveling agent (trade name: Pellenol S4; made by SAN NOPCO Ltd.) in a container and mixing these by stirring. Here, the viscosity at 23±1° C. was 30 to 60 Pa/s. As a curing agent, 6.5 weight parts of an imidazole curing agent (made by Shikoku Corp.; trade name: 2E4MZ-CN) was used. After filling with and then drying resin 450, the top surface of the substrate in the middle of preparation was polished and flattened until the surface of the upper metal layer 426 became exposed, and the resin 450 was then cured by heating at 100° C. for 1 hour and at 150° C. for 1 hour and thereby made into an inter-high-dielectric-constant-layer filling layer 452 (see FIG. 5F).

Through holes 454 that reach the top surface of the wiring pattern 32 of the build-up portion 30 were then formed by means of a carbon dioxide gas laser, UV laser, YAG laser, or excimer laser, etc., at predetermined positions of the top surface of the substrate in the middle of preparation on which the inter-high-dielectric-constant-layer filling layer 452 had been formed (see FIG. 6A). After then adding an electroless plating catalyst on the top surface of the substrate in the middle of preparation, the substrate was immersed in an aqueous electroless copper plating solution to form an electroless copper plating film 456 of 0.6 to 3.0 μm thickness on the inner walls of the through holes 454, the surface of high dielectric constant sheet 420, and the surface of the inter-high-dielectric-constant-layer filling layer 452 (see FIG. 6B). The composition of the aqueous electroless plating solution used was: 0.03 mol/L of copper sulfate, 0.200 mol/L of EDTA, 0.1 g/L of HCHO, 0.1 mol/L of NaOH, 100 mg/L of α,α'-bipyridyl, and 0.1 g/L of polyethylene glycol (PEG).

A commercially available dry film 460 was then adhered onto electroless copper plating film 456 (see FIG. 6C), through holes 462 were formed by exposure/development and etching (see FIG. 6D), and an electrolytic copper plating film 464 of 25 μm was formed on the surface of the through holes 462 (see FIG. 6E). The composition of the electrolytic copper plating solution used was: 200 g/L of sulfuric acid, 80 g/L of copper sulfate, and 19.5 ml/L of an additive (Cupracid GL, made by ATOTECH Japan Co., Ltd.). The electrolytic copper plating was carried out under the conditions of a current density of 1 A/dm$^2$, a duration of 115 minutes, and a temperature of 23±2° C. Dry film 460 was then peeled off, and the portions on which dry film 460 had remained, that is, the portions of electroless copper plating film 456 existing between portions of electrolytic copper plating film 464, and the exposed portions of the upper metal layer 426 of the high dielectric constant sheet 420 were etched by a sulfuric acid—hydrogen peroxide based etching solution (see FIG. 6F). Through these steps, the layered capacitor portion 40 was formed on the build-up portion 30. That is, copper foil 422 corresponds to being the first layer electrode 41, the high dielectric constant layer 424 corresponds to being the high dielectric constant layer 43, and the upper metal layer 426, the electroless copper plating film 456 and the electrolytic copper plating film 464 correspond to being the second layer electrode 42.

The substrate in the middle of preparation, on which the electrolytic copper plating film 464 had been formed, was then subject to a blackening treatment in a blackening bath (oxidizing bath) of an aqueous solution containing NaOH (10 g/L), NaClO$_2$ (40 g/L), and Na$_3$PO$_4$ (6 g/L) and a reduction treatment in a reducing bath of an aqueous solution containing NaOH (10 g/L) and NaBH$_4$ (6 g/L) to roughen the surface of the electrolytic copper plating film 464 (not shown). Thereafter, a resin insulating sheet 470 was adhered onto the layered capacitor portion 40 by a vacuum laminator under lamination conditions of a temperature of 50 to 150° C. and a pressure of 0.5 to 1.5 MPa, and curing at 150° C. was carried out for 3 hours (see FIG. 7A). This resin insulating sheet 470 is a modified epoxy based resin sheet, a polyphenylene ether based resin sheet, a polyimide based resin sheet, a cyanoester based resin sheet, or an imide based resin sheet, and may contain a thermoplastic resin, such as a polyolefin based resin or a polyimide based resin, a thermosetting resin, such as silicone resin, or a rubber based resin, such as SBR, NBR, urethane, etc., and may have dispersed therein a fibrous, filler, or flattened inorganic based material of silica, alumina, zirconia, etc. The Young's modulus of this resin insulating sheet 470 is preferably 10 to 1000 MPa. The Young's modulus of the resin insulating sheet 470 within this range can adequately relax the stress that occurs due to a thermal expansion coefficient difference between the semiconductor element and the substrate.

Through holes 472 of 65 μmφ were then formed in the resin insulating sheet 470 using a CO$_2$ laser under the conditions of an energy density of 2.0 mj and 1 shot (see FIG. 7B). Immersion for 10 minutes in a solution of 80° C. containing 60 g/L of permanganic acid was then performed to roughen the surface of the resin insulating sheet 470. The substrate in the middle of preparation that had been roughened was then immersed in a neutralizing solution (trade name: Circuposit MLB Neutralizer; made by Shipley Company L.L.C) and was washed with water. The substrate was furthermore immersed in a catalyst solution containing palladium chloride (PdCl$_2$) and stannous chloride (SnCl$_2$) to precipitate palladium metal and thereby add a palladium catalyst to the surface (including the inner walls of the through holes 472) of the resin insulating sheet 470. The substrate was then immersed in an aqueous electroless copper plating solution and was treated for 40 minutes at a liquid temperature of 34° C. to form an electroless copper plating film of 0.6 to 3.0 μm thickness on the surface of resin insulating sheet 470 and the wall surfaces of the through holes 472 (not shown). The composition of the aqueous electroless plating solution used was: 0.03 mol/L of copper sulfate, 0.200 mol/L of EDTA, 0.1 g/L of HCHO, 0.1 mol/L of NaOH, 100 mg/L of α,α'-bipyridyl, and 0.1 g/L of polyethylene glycol (PEG). The dry film was then formed on the electroless copper plating film and an electrolytic copper plating film of 25 μm thickness was formed under the following conditions (not shown). The composition of the electrolytic copper plating solution used was: 200 g/L of sulfuric acid, 80 g/L of copper sulfate, and 19.5 ml/L of an additive (Cupracid GL, made by ATOTECH Japan Co., Ltd.). The electrolytic copper plating was carried out under the conditions of a current density of 1 A/dm$^2$, a duration of 115 minutes, and a temperature of 23±2° C. The dry film 460 was then peeled off and the multilayer printed wiring board 10, such as shown in FIGS. 1 and 2, was obtained (FIG. 7C). The resin insulating sheet 470 corresponds to being the stress relaxing portion 50. The copper plating films 474 that fill the through holes 472 correspond to being the various terminals 61, 62, and 63.

After the above, solder bumps may be formed by coating on and drying a commercially available solder resist composition, setting a soda lime glass substrate, on which a pattern of circles (mask pattern) of solder resist openings are drawn by a chromium layer, so that the side on which the chromium layer is formed is put in close contact with the solder resist layer, carrying out exposure and development with ultraviolet rays and heating to form a solder resist layer pattern, with which the upper surfaces of the respective terminals 61, 62, and 63 are opened, performing electroless nickel plating and electroless gold plating to form a nickel plating layer and a gold plating layer, printing on solder paste, and then carrying out reflow. The solder resist layer may either be formed or not be formed.

With the multilayer printed wiring board 10 described in detail above, since the high dielectric constant layer 43 of the layered capacitor portion 40, which is connected between the power supply line and the ground line, is made of ceramic, the dielectric constant can be high in comparison to the conventional case of using an organic resin having an inorganic filler blended in and the static capacitance of the layered capacitor portion 40 can be high. An adequate decoupling effect can thus be provided and instantaneous potential drops are made unlikely to occur even if the on/off frequency of the semiconductor element is high and in the range of several GHz to several dozen GHz (for example, 3 GHz to 20 GHz).

The build-up portion 30 is normally prepared under a temperature condition of not more than 200° C. and it is thus difficult to calcine a high dielectric constant material and make it into a ceramic in the middle of forming the build-up portion 30. However, in the above-described example, since the high dielectric constant layer 43 of layered capacitor portion 40 is prepared by calcining a high dielectric constant material into a ceramic separately from the build-up portion 30, the dielectric constant can be adequately high readily.

In the first layer electrode 41 consisting the layered capacitor portion 40 is a solid pattern that is formed on the first surface, that is, the lower surface of the high dielectric constant layer 43 which is, of the respective surfaces of the high dielectric constant layer 43, is the far from the mounting portion 60. The second layer electrode 42 is a solid pattern that is formed on the second surface, that is, the upper surface of the high dielectric layer 43, which is close to the mounting portion 60 and has passage holes 42a, through which via holes 61a connected to the first layer electrode 41 pass in a non-contacting manner. The areas of the respective layered electrodes 41 and 42 can be thus adequately large and the static capacitance of the layered capacitor portion 40 can be high. Since the via holes 61a connected to the first layer electrode 41 and the via holes 62a connected to the second layer electrode 42 are aligned alternatingly in lattice form, the loop inductance is low and instantaneous potential drops can be prevented readily. The via holes 61a and the via holes 62a may be aligned in an alternating zigzag manner, and the same effects can be obtained in this case as well.

Furthermore, in the layered capacitor portion 40, the distance between the first and second layer electrodes 41 and 42 is set to a distance that is not more than 10 μm and yet at which shorting will practically not occur. The distance between electrodes of the layered capacitor portion 40 is adequately small and the static capacitance of the layered capacitor portion 40 can be high.

In the case where the static capacitance is inadequate with just the layered capacitor portion 40, chip capacitors 73 can be provided to compensate the inadequact. That is, the chip capacitors 73 may be mounted as necessary. The decoupling effect is lowered as the wiring between the chip capacitor 73 and the semiconductor element is longer. However, in the above-described example, the chip capacitor 73 is installed on the top surface side at which the mounting portion 60 is disposed. The wiring to the semiconductor element can be short and the lowering of the decoupling effect can be restrained.

Also, even if stress occurs due to a thermal expansion difference between the semiconductor element, mounted on the mounting portion 60 and the layered capacitor 40 or the build-up portion 30, the stress relaxing portion 50 adequately absorbs the stress. The stress relaxing portion 50 may be formed just below the semiconductor element mounted on the mounting portion 60. Since stress due to a thermal expansion difference mainly becomes a problem below the semiconductor element, the material cost can be held down by forming the stress relaxing portion 50 at this portion.

This invention is by no means restricted to the above-described example and may obviously be put into practice in various modes within the scope of the art of this invention.

Example 2

Figure 8:
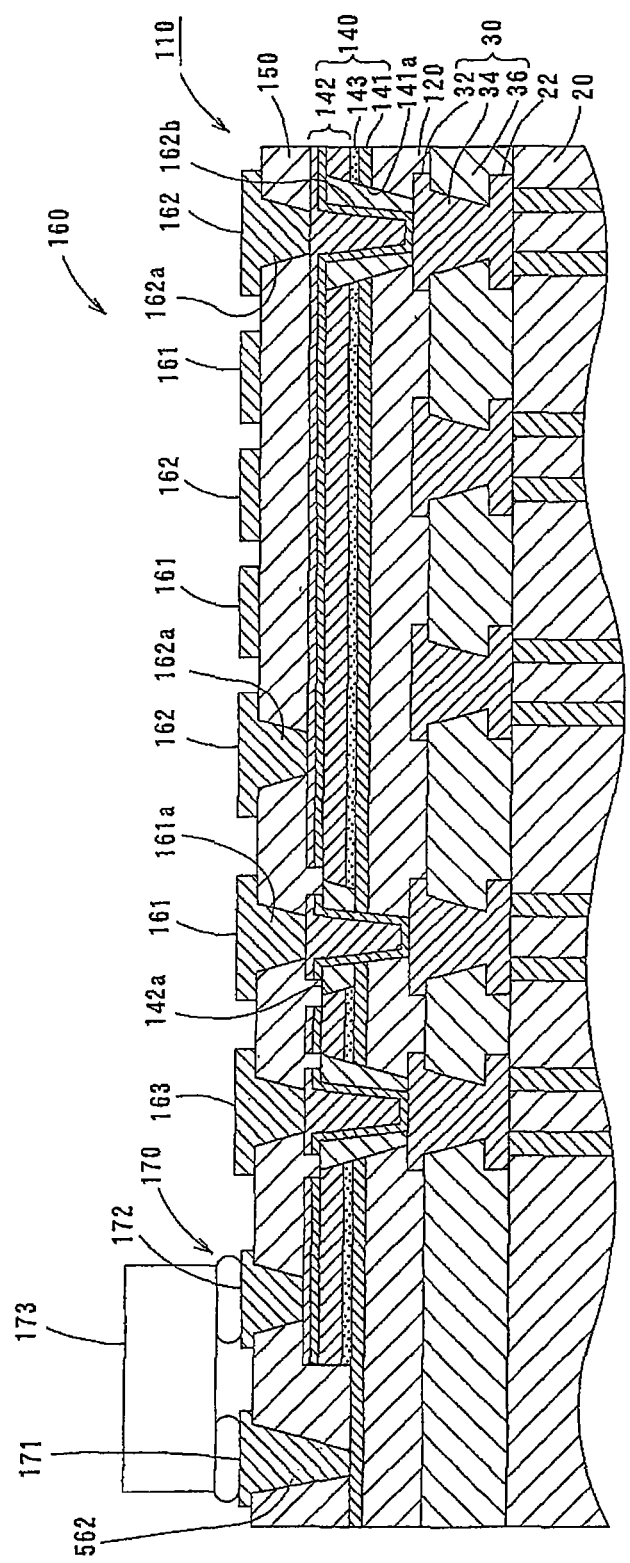
FIG. 8 is a longitudinal section of a multilayer printed wiring board 110 of an Example 2.

FIG. 8 is a longitudinal section (showing only the left side of a central line) of a multilayer printed wiring board 110 of Example 2. As shown in FIG. 8, the multilayer printed wiring board 110 of the present example has the same core substrate 20 as Example 1, the build-up portion 30 in which wiring patterns 32 and 22 laminated via resin insulating layer 36 on the upper surface of core substrate 20 are electrically connected by via holes 34, an interlayer insulating layer 120, laminated on the build-up portion 30, a layered capacitor portion 140, laminated on the interlayer insulating layer 120 and arranged with a high dielectric constant layer 143 and the first and second layer electrodes 141 and 142 that sandwich the high dielectric constant layer 143, a stress relaxing portion 150, laminated on the high dielectric constant layer 143 and formed of an elastic material, a mounting portion 160, on which a semiconductor element is mounted, and the chip capacitor positioning regions 170, provided at the periphery of mounting portion 160.

In the layered capacitor portion 140 of the present example, the first layer electrode 141 is a copper electrode that is electrically connected through via holes 161a to ground pads 161 of the mounting portion 160, and the second layer electrode 142 is a copper electrode that is electrically connected through via holes 162a to power supply pads 162 of the mounting portion 160. The first and second layer electrodes 141 and 142 are thus connected to the ground line and the power supply line, respectively of the semiconductor element mounted on the mounting portion 160.

The first layer electrode 141 is a solid pattern formed on the lower surface of the high dielectric constant layer 143 and has passage holes 141a, through which via holes 162b connected to the second layer electrode 142 pass in a non-contacting manner. Though via holes 162b may be provided in correspondence to all power supply pads 162, here, via holes 162b are provided in correspondence to a portion of power supply pads 162. The reason for this is as follows. That is, of all power supply pads 162, some power supply pads 162 are connected through via holes 162a to the second layer electrode 142 and the remaining power supply pads 162 are electrically connected by unillustrated wirings (for example, wirings provided on the mounting portion 160) to the other power supply pads 162 that are electrically connected through via holes 162a to the second layer electrode 142, and since all power supply pads 162 are thus connected to the second layer electrode 142, as long as there is at least one via hole 162b that extends downwards from the second layer electrode 142, all power supply pads 162 can be connected to the external power supply line through that via hole 162b. Since by providing via holes 162b in correspondence to a portion of power supply pads 162, the number of passage holes 141a to be provided in the first layer electrode 141 can be small, the area of the first layer electrode 141 can be large and the static capacitance of the layered capacitor portion 140 can be high. The number of passage holes 141a and the positions at which passage holes 141a are to be formed are determined depending on the static capacitance of the layered capacitor portion 140, the positioning of via holes 162a, etc.

The second layer electrode 142 is a solid pattern formed on the upper surface of the high dielectric constant layer 143 and has passage holes 142a, through which via holes 161a connected to ground pads 161 pass in a non-contacting manner. Though via holes 161a may be provided in correspondence to all ground pads 161, here, these are provided in correspondence to a portion of ground pads 161. The reason for this is as follows. That is, since ground pads 161 are electrically connected to each other by unillustrated wirings (for example, wirings provided on the mounting portion 160), as long as there is at least one via hole 161a that extends downwards from a ground pad 161 and contacts the first layer electrode 141 without contacting the second layer electrode 142, all ground pads 161 can be connected to the external ground line through that via hole 161a. Since by providing via holes 161a in correspondence to a portion of ground pads 161, the number of passage holes 142a to be provided in the second layer electrode 142 can be small, the area of the second layer electrode 142 can be large and the static capacitance of layered capacitor portion 140 can be high. The number of passage holes 142a and the positions at which passage holes 142a are to be formed are determined depending on the static capacitance of the layered capacitor portion 140, the positioning of via holes 161a, etc.

Since the static capacitance of the layered capacitor portion 140 can thus be made high, an adequate decoupling effect can be exhibited and the transistor of the semiconductor element (IC) mounted on the mounting portion 160 will be unlikely to become short of power. The wiring for electrically connecting ground pads 161, not having via holes below, to ground pads 161 having via holes below, and the wiring for electrically connecting power supply pads 162, not having via holes below, to power supply pads 162 having via holes below, may be provided on the mounting portion 60 or may be provided on the top surface of the core substrate 20 or on the build-up portion 30. The connections may also be made by a wiring layer disposed between the layered capacitor portion 140 and the mounting portion 160.

The stress relaxing portion 150 is formed of the same elastic material as in Example 1. Also, ground pads 161, power supply pads 162, and signal pads 163, disposed on the mounting portion 160, are aligned in a lattice-like or zigzag manner (see FIG. 1). Ground pads 161 and power supply pads 162 may be aligned in a lattice-like or zigzag manner near the center and signal pads 163 may be aligned in a lattice-like manner, a zigzag manner, or randomly in the periphery. The number of terminals of the mounting portion 60 is 1000 to 300000. A plurality of chip capacitor positioning regions 170 are formed in the periphery of the mounting portion 160. A plurality of pairs of ground pads 171 and power supply pads 172 are formed in the chip capacitor positioning regions 170 so as to be connected with the ground terminals and power supply terminals, respectively, of chip capacitors 173, The respective ground pads 171 are connected via the first layer electrode 141 of the layered capacitor portion 140 to the negative electrode of an external power supply and the respective power supply pads 172 are connected via the second layer electrode 142 to the positive electrode of the external power supply. In the present example, ground pads 161 and power supply pads 162 respectively correspond to being the first pads and the second pads, and via holes 161a and via holes 162b respectively correspond to being the first rod terminals and the second rod terminals.

Figure 9:
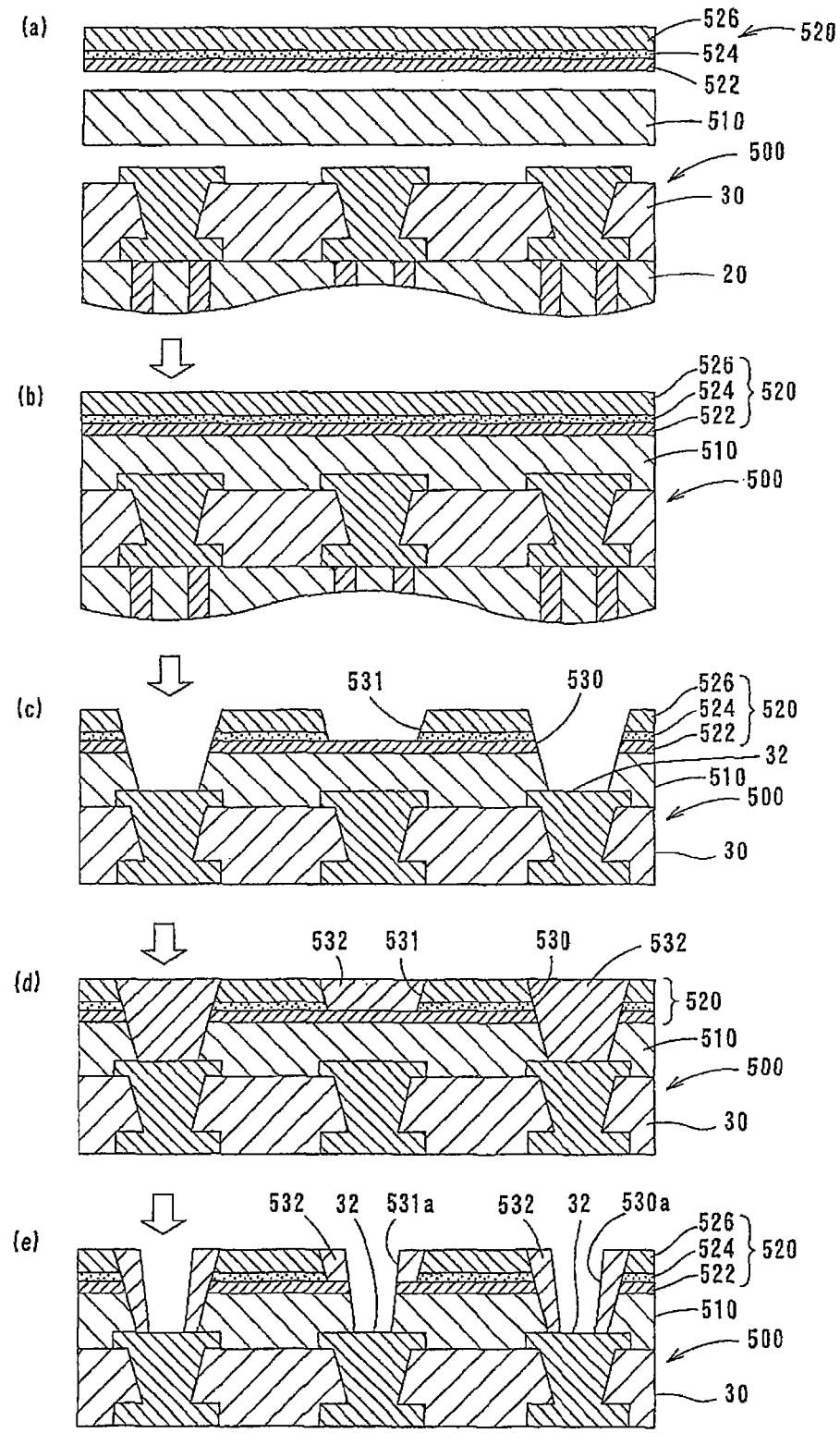
FIG. 9 is an explanatory diagram of a process for manufacturing the multilayer printed wiring board 110.
Figure 10:
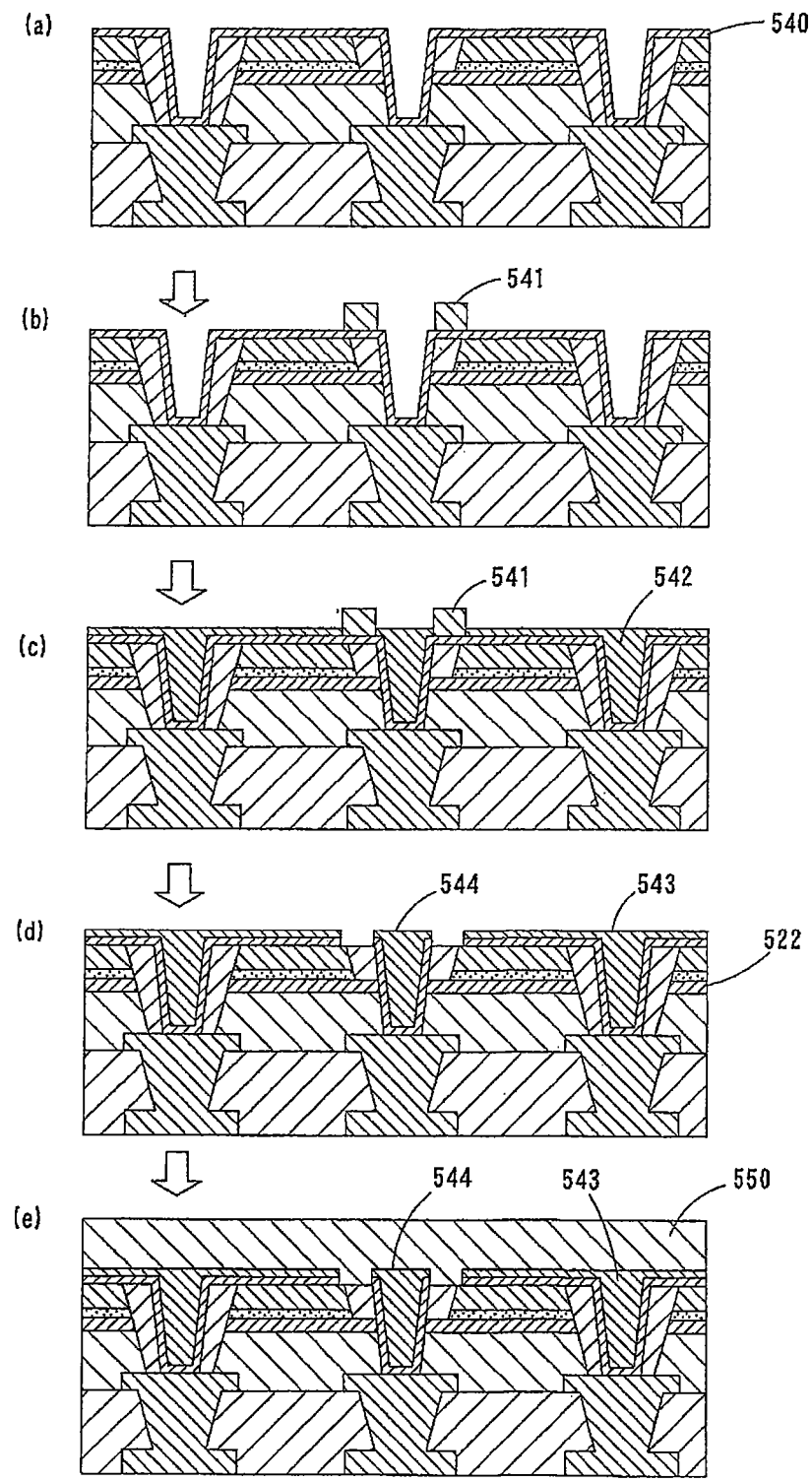
FIG. 10 is an explanatory diagram of a process for manufacturing the multilayer printed wiring board 110.
Figure 11:
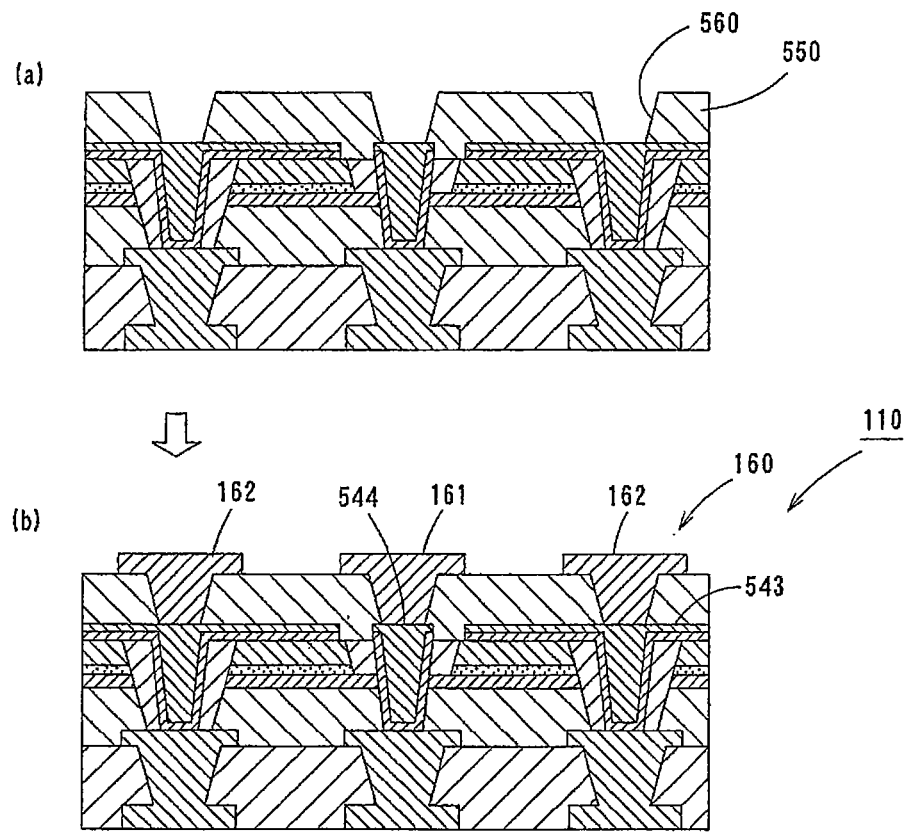
FIG. 11 is an explanatory diagram of a process for manufacturing the multilayer printed wiring board 110.

The procedures for manufacturing the multilayer printed wiring board 110 of the present example shall now be described with reference to FIGS. 9 to 11.

Figure 12:
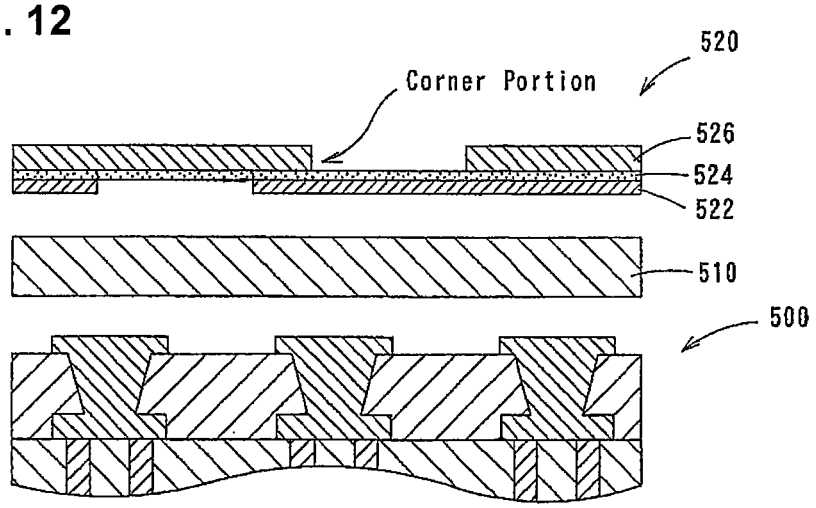
FIG. 12 is an explanatory diagram of a high dielectric constant sheet 520 with corner portions.

First, as shown in FIG. 9A, a substrate 500 having the build-up portion 30 formed at least on one surface of the core substrate 20 was prepared and using a vacuum laminator, an interlayer insulating layer 510 (to become interlayer resin layer 120 of FIG. 8; a thermosetting insulating film; ABF-45SH, made by AJINOMOTO Co., Inc.) was adhered onto the build-up portion 30 under lamination conditions of a temperature of 50 to 150° C. and a pressure of 0.5 to 1.5 MPa. A high dielectric constant sheet 520, which had been prepared in advance and having a structure in which a high dielectric constant layer 524 is sandwiched between a copper foil 522 and a copper foil 526, was then adhered onto the interlayer insulating layer 510 under lamination conditions of a temperature of 50 to 150° C. and a pressure of 0.5 to 1.5 MPa using a vacuum laminator and thereafter, drying at 150° C. was performed for 1 hour (see FIG. 9B). At the stage of lamination, both copper foils 522 and 526 of high dielectric constant sheet 520 are preferably solid layers that do not have circuits formed therein. When portions of copper foils 522 and 526 are removed by etching, etc., due to (i) portions, at which the percentages of metal remaining differ between the top and back surfaces, and portions, at which the metal has been removed, becoming starting points of bending or folding of the high dielectric constant sheet, (ii) the existence of corner portions (see FIG. 12) due to removal of a copper foil portion and the concentrating of stress at such portions, (iii) direct contacting of the laminator with the high dielectric constant layer, etc., cracks tend to form readily in the high dielectric constant layer and short circuiting may occur across the respective copper foils when such cracked portions are filled with plating in a subsequent plating step. Also when portions of the electrodes are removed prior to lamination, the static capacitance of the high dielectric constant sheet deceases and in laminating the high dielectric constant sheet, the need to position and then adhere the high dielectric constant sheet and the build-up portion arises. Furthermore, since the high dielectric constant sheet is thin and does not have rigidity, the positional precision becomes poor when portions of the copper foils are removed. In addition, since portions of the copper foils must be removed in consideration of the alignment precision, somewhat large areas of the copper foils must be removed and the alignment precision will be poor since the high dielectric constant sheet is thin. Due to the above, at the stage of lamination, both copper foils 522 and 526 of the high dielectric constant sheet 520 are preferably solid layers in which circuits are not formed.

Procedures for preparing the high dielectric constant sheet 520 shall now be described.

(1) Diethoxy barium and titanium bitetraisopropoxide, which had been weighed out to provide concentrations of 1.0 moles/liter, were dissolved in a mixed solvent of dehydrated methanol and 2-methoxyethanol (volume ratio: 3:2) in dried nitrogen and stirring was performed for 3 days at room temperature under a nitrogen atmosphere to prepare an alkoxide precursor composition solution. This precursor composition solution was then stirred while keeping at 0° C. and water that had been decarbonated in advance was sprayed at a rate of 0.5 microliters/minute in a nitrogen gas flow to carry out hydrolysis.

(2) The sol-gel solution thus prepared was passed through a 0.2 micron filter to filter out precipitates, etc.

(3) The filtrate prepared in (2) above was spin coated at 1500 rpm for 1 minute on the copper foil 522 (to subsequently become the first layer electrode 141) of 12 μm thickness. The substrate onto which the solution was spin coated was then dried by keeping for 3 minutes on a hot plate maintained at 150° C. The substrate was then inserted in an electric oven kept at 850° C. and calcined for 15 minutes. Here, the viscosity of the sol-gel solution was adjusted so that the film thickness obtained after 1 time of spin coating, drying, and calcining will be 0.03 μm. Nickel, platinum, gold, or silver, etc., may be used instead of copper as the first layer electrode 141.

(4) Spin coating, drying, and calcining were repeated 40 times and a high dielectric constant layer 524 of 1.2 μm was obtained.

(5) Thereafter, using a sputterer or other vacuum vapor deposition device, a copper layer was formed on the high dielectric constant layer 524, and by furthermore adding approximately 10 μm of copper by electrolytic plating, etc., on the copper layer, the copper foil 526 (subsequently forming a portion of the second layer electrode 142) was formed. The high dielectric constant sheet 520 was thus obtained. Upon measuring the dielectric characteristics using an impedance/gain phase analyzer (trade name: 4194A; made by Hewlett-Packard Development Company, L.P.) under the conditions of a frequency of 1 kHz, a temperature of 25° C., and an OSC level of 1V, the relative permittivity was found to be 1,850. A metal layer of platinum, gold, etc., may be formed instead of the copper layer by the vacuum vapor deposition, and a metal layer of nickel, tin, etc., may be formed instead of the copper layer by the electrolytic plating. Also, though the high dielectric constant layer was formed of barium titanate, the high dielectric constant layer may instead be formed of any of strontium titanate ($SrTiO_3$), tantalum oxide ($TaO_3$, $Ta_2O_5$), lead zirconate titanate (PZT), lead lanthanum zirconate titanate (PLZT), lead niobium zirconate titanate (PNZT), lead calcium zirconate titanate (PCZT), and lead strontium zirconate titanate (PSZT) by using another sol-gel solution.

As another method of preparing the high dielectric constant sheet 520, there is also the following method. That is, a barium titanate powder (HPBT Series, made by Fuji Titanium Industry Co., Ltd.) is dispersed in a binder solution, wherein, with respect to the total weight of the barium titanate powder, 5 weight parts of polyvinyl alcohol, 50 weight parts of pure water, and 1 weight part of dioctyl phthalate or dibutyl phthalate as a solvent-based plasticizer are mixed. The dispersion is then printed as a thin film of approximately 5 to 7 μm thickness onto the copper foil 522 (to subsequently become the first layer electrode 141) of 12 μm thickness using a roll coater, doctor blade, α-coater, or other printing device and then dried for 1 hour at 60° C., 3 hours at 80° C., 1 hour at 100° C., 1 hour at 120° C., and 3 hours at 150° C. and thereby made into an uncalcined layer. Besides $BaTiO_3$, a paste containing one or two or more types of metal oxide selected from the group consisting of $SrTiO_3$, $TaO_3$, $Ta_2O_5$, PZT, PLZT, PNZT, PCZT, and PSZT may be printed as a thin film of 0.1 to 10 μm thickness using a roll coater, doctor blade, or other printing device and then dried to an uncalcined layer. After printing, the uncalcined layer is calcined at a temperature range of 600 to 950° C. and thereby made into the high dielectric layer 524. Thereafter, using a sputterer or other vacuum vapor deposition device, a copper layer is formed on the high dielectric constant layer 524 and by furthermore adding approximately 10 μm of copper by electrolytic plating, etc. on the copper layer, the copper foil 526 (subsequently forming a portion of the second layer electrode 142) is formed. A metal layer of platinum, gold, etc., may be formed instead of the copper layer by the vacuum vapor deposition, and a metal layer of nickel, tin, etc., may be formed instead of the copper layer by the electrolytic plating. Sputtering using barium titanate as the target may also be employed.

Through holes 530 and 531 were then formed by means of a carbon dioxide gas laser, UV laser, YAG laser, excimer laser, etc., at predetermined positions of the top surface of the substrate in the middle of preparation on which the high dielectric constant sheet 520 had been formed (see FIG. 9C). Through holes 530 of deep depth are through holes that pass through the high dielectric constant sheet 520 and interlayer insulating layer 510 and reach the top surface of the wiring pattern 32 of the build-up portion 30. Through holes 531 of shallow depth are through holes that pass through the copper foil 526 and high dielectric constant layer 524 and reach the top surface of the copper foil 522. Here, in forming the through holes, first, the deep through holes 530 were formed and then the shallow through holes 531 were formed. The depth was adjusted by changing the number of laser shots. Specifically, through holes 531 were formed using a UV laser made by Hitachi Via Mechanics, Ltd. at conditions of an output of 3 to 10 W, a frequency of 30 to 60 kHz, and a number of shots of 4, and the through holes 530 were formed with the same conditions besides the number of shots being set to 31. The interiors of the through holes 530 and 531 were then filled with a through hole filling resin 532 to be described below and then dried for 1 hour at 80° C., 1 hour at 120° C., and 30 minutes at 150° C. (see FIG. 9D). Through holes 530 and 531 were not formed to correspond to all (3000000) power supply pads 162 and ground pads 161 shown in FIG. 8.

The through hole filling resin was prepared as follows. 100 weight parts of bisphenol F epoxy monomer (trade name: E-807; made by Yuka Shell Epoxy Co., Ltd.; molecular weight: 310) were mixed with 6 weight parts of an imidazole curing agent (trade name: 2E4MZ-CN; made by Shikoku Corp.), then 170 weight parts of spherical $SiO_2$ particles of an average particle diameter of 1.6 μm were mixed into this mixture, and by kneading using a three-roll mill, the viscosity at 23±1° C. of the mixture was adjusted to 45000 to 49000 cps. The through hole filling resin was thus obtained.

Through holes 530a and 531a were then formed in the through hole filling resin 532 filled in the prior step, roughening was carried out by immersion in a permanganic acid solution, and complete curing was carried out by drying and curing for 3 hours at 170° C. (see FIG. 9E). Through holes 530a are through holes that pass through the through hole filling resin 532 and reach the top surface of the wiring pattern 32 of the build-up portion 30. The other through holes 531a are through holes that pass through the through hole filling resin 532, copper foil 422, and interlayer insulating layer 510 and reach the top surface of the wiring pattern 32 of the build-up portion 30. Through holes 530a were formed using a $CO_2$ laser at conditions of an energy density of 2.0 mj and 2 shots via a mask diameter of 1.4 mmϕ, and through holes 531a were formed with the same conditions with the exceptions of using a UV laser and the number of shots being set to 52 (output: 3 to 10 w; frequency: 30 to 60 kHz).

Thereafter, an electroless copper plating catalyst was added to the top surface of the substrate and by immersion in the electroless plating solution described below, an electroless copper plating film 540 of 0.6 to 3.0 μm was formed on the top surface of the substrate (see FIG. 10A). The composition of the aqueous electroless plating solution used was: 0.03 mol/L of copper sulfate, 0.200 mol/L of EDTA, 0.1 g/L of HCHO, 0.1 mol/L of NaOH, 100 mg/L of α,α'-bipyridyl, and 0.1 g/L of polyethylene glycol (PEG).

A plating resist 541 was then formed by adhering a commercially available dry film onto the electroless copper plating film 541 and performing exposure and development (see FIG. 10B), and an electrolytic copper plating film 542 of 25 μm thickness was formed on portions at which the plating resist was not formed (see FIG. 10C). The composition of the electrolytic copper plating solution used was: 200 g/L of sulfuric acid, 80 g/L of copper sulfate, and 19.5 ml/L of an additive (Cupracid GL, made by ATOTECH Japan Co., Ltd.). The electrolytic copper plating was carried out under the conditions of a current density of 1 A/dm$^2$, a duration of 115 minutes, and a temperature of 23±2° C. Plating resist 541 was then peeled off, and the portions on which plating resist had 541 remained, that is, the portions of electroless copper plating film 540, existing between portions of electrolytic copper plating film 542, were etched (quick etched) by a sulfuric acid—hydrogen peroxide based etching solution to form lands 544, connected to the upper electrode 543 and copper foil 522 (see FIG. 10D).

A stress relaxing sheet 550 (to become the stress relaxing portion 150 in FIG. 8) was then adhered onto the upper electrode 543 and lands 544 under lamination conditions of a temperature of 50 to 150° C. and a pressure of 0.5 to 1.5 MPa, and then drying at 150° C. was carried out for 1 hour (see FIG. 10E).

The stress relaxing sheet 550 was prepared as follows. That is, a resin composition, prepared by dissolving 100 weight parts of a naphthalene type epoxy resin (trade name: NC-7000L; made by NIPPON KAYAKU CO., LTD.), 20 weight parts of a phenol-xylylene glycol condensate resin (trade name: XLC-LL; made by Mitsui Chemicals Inc.), 90 weight parts of a carboxylic acid modified NBR with a Tg of −50° C. (trade name: XER-91; made by JSR Co., Ltd.) as crosslinked rubber particles, and 4 weight parts of 1-cyanoethyl-2-ethyl-4-methylimidazole in 300 weight parts of ethyl lactate, was coated using a roll coater (made by Cermatronics Boeki Co., Ltd.) onto a polymethylpentene (TPX) (trade name: Opulan X-88; made by Mitsui Petrochemical Industries Ltd.) film of 42 to 45 μm thickness and thereafter dried for 2 hours at 80° C., 1 hour at 120° C., and 30 minutes at 150° C. to obtain the stress relaxing sheet of 40 μm thickness. This stress relaxing sheet has a Young's modulus of 500 Mpa at 30° C.

Via holes 560 were then formed at predetermined positions of the stress relaxing sheet 550 using a $CO_2$ laser at conditions of an energy density of 2.0 mj and 1 shot via a mask diameter of 1.4 mmφ (see FIG. 11A). Roughening was then carried out and then the stress relaxing sheet 550 was cured completely by drying and curing at 150° C. for three hours. By then applying the steps of catalyst addition, chemical copper plating, plating resist formation, electric copper plating, plating resist removal, and quick etching, via holes 560 were filled with metal and pads (ground pads 161, power supply pads 162, and signal pads 163) were formed on the upper surfaces of the respective via holes 560 at the topmost surface, and the multilayer printed wiring board 110 having the mounting portion 160 was thereby obtained (FIG. 11B). Ground pads 161 connected to the lands 544 and copper foil 542 are connected to the ground line, and power supply pads 162 connected to upper electrode 543 are connected to the power supply line. Signal pads 163 are connected to the signal line. Here, the copper foil 522 corresponds to being the first layer electrode 141, the copper foil 526 and upper electrode 543 correspond to being the second layer electrode 142, the high dielectric constant layer 524 corresponds to being the high dielectric layer 143, and these make up the layered capacitor portion 140.

At this stage, solder bumps may be formed on the respective terminals of the mounting portion 60 (see the description concerning Example 1 for the forming method). Also, to mount a chip capacitor 173 as shown in FIG. 8, an etching step (so-called tenting) was performed after the step of FIG. 9B so that one terminal of the chip capacitor 173 will be electrically connected by a conductor 562 to the first layer electrode 141. Though a cupric chloride etching solution was used in the etching process, the process was carried out in a short time so that after etching the metal layer 526 and high dielectric layer 524, the copper foil 522 was etched only slightly. Lastly, a metal layer connected to this copper foil 522 was disposed on the stress relaxing sheet 550 and the pad 171 was disposed on the upper surface of the metal layers. The pad 172 to be connected to the other terminal of the chip capacitor 173 was formed on the upper surface of a metal filled in one of the via holes 560 formed in the stress relaxing sheet 550.

The multilayer printed wiring board 110 of Example 2 described above provides the same effects as those of the Example 1. In the present Example, the opposing area S of the first layer electrode 141 and the second layer electrode 142 was determined so that the static capacitance C of the layered capacitor portion 140 will be 0.5 μF below the die, and based on this opposing area S, the number and positions of the passage holes 141a of the first layer electrode 141 and the number and positions of the passage holes 142a of the second layer electrode 142 were determined. Here, the opposing area S was computed from $C=\epsilon_0 \cdot \epsilon_r \cdot d/S$. That is, since the relative permittivity $\epsilon_r$ of the high dielectric constant layer 142 is 1850 and the thickness d thereof is 1.2 μm, by substituting these values in the above equation and substituting 0.5 μF as the static capacitance C, the opposing area S was computed. $\epsilon_0$ is the permittivity of vacuum (constant).

Example 3

Figure 13:
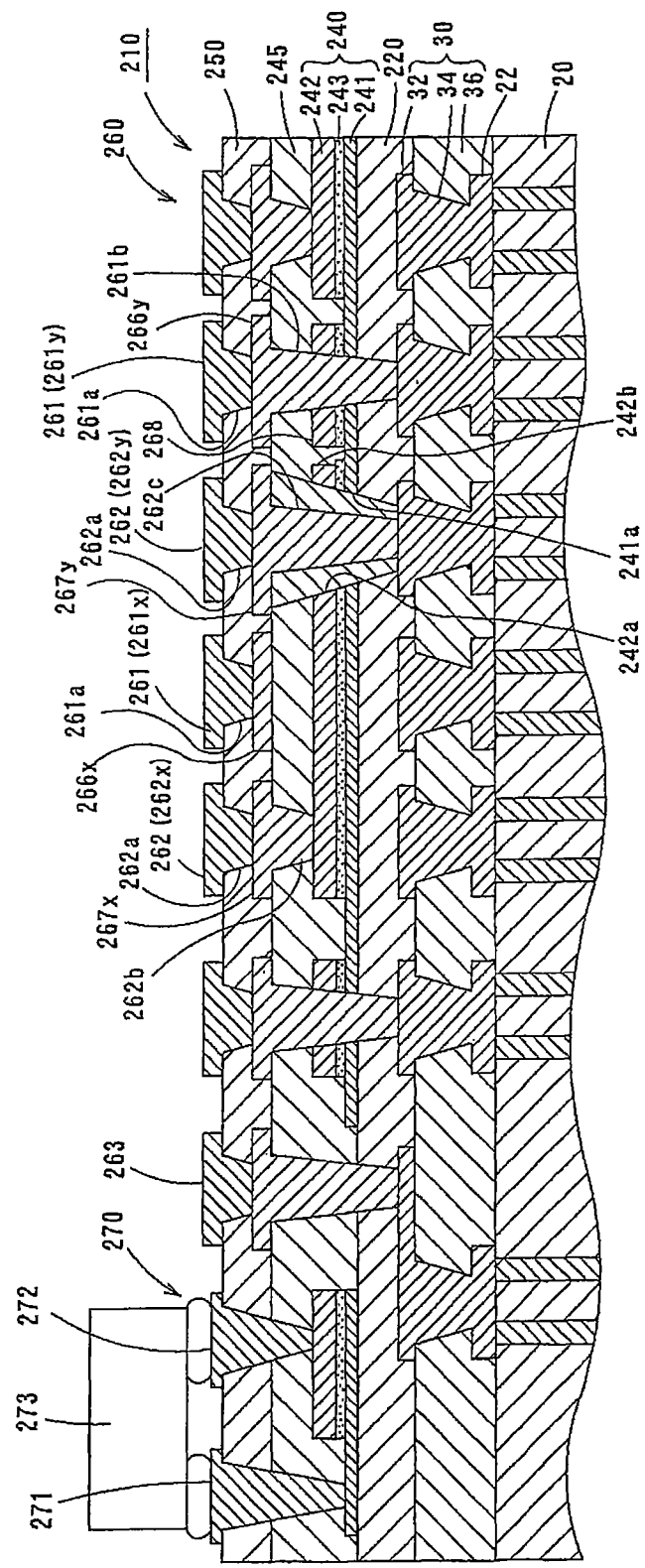
FIG. 13 is a longitudinal section of a multilayer printed wiring board 210 of an Example 3.

FIG. 13 is a longitudinal section (showing only the left side of a central line) of a multilayer printed wiring board 210 of an Example 3. As shown in FIG. 13, the multilayer printed wiring board 210 of the present example has the same core substrate 20 as Example 1, the build-up portion 30 in which wiring patterns 22 and 32 laminated via the resin insulating layer 36 at the upper surface of the core substrate are electrically connected by means of via holes 34, an interlayer insulating layer 220, laminated on the build-up portion 30, a layered capacitor portion 240, laminated on interlayer insulating layer 220 and arranged with a high dielectric constant layer 243 and the first and second layer electrodes 241 and 242 that sandwich the high dielectric constant layer 243, an interlayer insulating layer 245, laminated on the layered capacitor portion 240, a stress relaxing portion 250, formed of an elastic material and laminated on the interlayer insulating 245, a mounting portion 260, on which a semiconductor element is mounted, and chip capacitor positioning regions 270, provided at the periphery of the mounting portion 260.

In the layered capacitor portion 240 of the present example, the first layer electrode 241 is a solid pattern copper electrode that is formed on the lower surface of the high dielectric constant layer 243 and is electrically connected to the ground pads 261 of the mounting portion 260. For the sake of description, ground pads 261 shall be classified into the two types of ground pads 261x and ground pads 261y. Of these, ground pads 261x are electrically connected through via holes 261a to lands 266x. These lands 266x do not have via holes below. Ground pads 261y are connected through via holes 261a to lands 266y, and the lands 266y are electrically connected through via holes 261b to the first layer electrode 241 and to the ground wiring of the wiring pattern 32 of the build-up portion 30. The lands 268, which are connected to via holes 261b are electrically independent of the second layer electrode 242. The lands 266x connected to the ground pads 261x and lands 266y connected to the ground pads 261y are electrically connected by a wiring 246 (see FIG. 14). All ground pads 261 are thus set to the same potential. The first layer electrode 241 is thus connected to the respective ground pads 261 and to the ground wiring of the wiring pattern 32 of the build-up portion 30 and is connected via this ground wiring to an external ground line. Also, though the first layer electrode 241 has passage holes 241a, through which via holes 262c to be described later pass through in a non-contacting manner, since via holes 262c are provided in correspondence to a limited number of power supply pads 262y as described later, the number of passage holes 241a does not have to be large. Consequently, the area of the first layer electrode 241 can be large and the static capacitance of the layered capacitor portion 240 can be high. The number of passage holes 241a and the positions at which passage holes 241a are to be formed are determined depending on the static capacitance of the layered capacitor portion 240, etc.

The second layer electrode 242 is a solid pattern copper electrode that is formed on the upper surface of the high dielectric constant layer 243 and is electrically connected to the power supply pads 262 of the mounting portion 260. For the sake of description, power supply pads 262 shall be classified into the two types of power supply pads 262x and power supply pads 262y. Of these, power supply pads 262x are electrically connected through via holes 262a to lands 267x and the lands 267x are electrically connected through via holes 262b to the second layer electrode 242. Power supply pads 262y are connected through via holes 262a to lands 267y, and the lands 267y are electrically connected through via holes 262c to the power supply wiring of the wiring pattern 32 of the build-up portion 30 without contacting first and second layer electrodes 241 and 242. The lands 267x connected to power supply pads 262x and the lands 267y connected to the power supply pads 262y are electrically connected by a wiring 247 (see FIG. 14). All power supply pads 262 are thus set to the same potential. The second layer electrode 242 is thus connected to the respective power supply pads 262 and to the power supply wiring of the wiring pattern 32 of the build-up portion 30 and is connected via this power supply wiring to an external power supply line. Power is thus supplied to the second layer electrode 242 from the power supply wiring of the wiring pattern 32 of the build-up portion 30 and through the via holes 262c, wiring 274, and via holes 262b. Also, though the second layer electrode 242 has passage holes 242a, through which via holes 262c pass through in a non-contacting manner, and passage holes 242b, for securing insulation with respect to lands 268, since via holes 262c are provided for power supply pads 262y, which are a portion of power supply pads 262, and passage holes 242b are provided in correspondence to ground pads 261y, which are a portion of ground pads 261, the numbers of passage holes 242a and 242b do not have to be large. Consequently, the area of the second layer electrode 242 can be large and the static capacitance of the layered capacitor portion 240 can be high. The numbers of passage holes 242a and 242b and the positions at which passage holes 242a and 242b are to be formed are determined depending on the static capacitance of the layered capacitor portion 240, etc.

Since the static capacitance of the layered capacitor portion 240 can thus be made high, an adequate decoupling effect can be exhibited and the transistor of the semiconductor element (IC) mounted on the mounting portion 260 will be unlikely to become short of power. Though ground pads 261x and ground pads 261y are connected via the wiring 246 on the interlayer insulating layer 245 and the power supply pads 262x and power supply pads 262y are connected via the wiring 247 on the interlayer insulating layer 245, these wirings may be provided on any layer (including the mounting portion) that is positioned above the second layer electrode or on the top surface of the core substrate 20 or on the build-up portion 30. Also, by connecting ground pads 261x with ground pads 261y and power supply pads 262x with power supply pads 262y by wirings at any of the layers, via holes 261a do not have to be disposed below all ground pads 261 and via holes 262a do not have to be disposed below all power supply pads 262. The number of lands in the layer below the mounting portion can thus be reduced. Since the number of via holes and the number of lands that need to be provided are thus reduced, a high density can be realized.

The stress relaxing portion 250 is formed of the same elastic material as in Example 1. Also, ground pads 261, power supply pads 262, and signal pads 263, disposed on the mounting portion 260, are aligned in a lattice-like or zigzag manner in the same manner as Example 1 (see FIG. 1), and the numbers of these are the same as those of Example 1. Here, signal pads 263 do not contact any of the first and second layer electrodes 241 and 242 of the layered capacitor portion 240. Ground pads 261 and power supply pads 262 may be aligned in a lattice-like or zigzag manner near the center and signal pads 263 may be aligned in a lattice-like manner, a zigzag manner, or randomly in the periphery. A plurality of chip capacitor positioning regions 270 are formed in the periphery of the mounting portion 260. A plurality of pairs of ground pads 271 and power supply pads 272 are formed in the chip capacitor positioning regions 270, so as to be connected with the ground terminals and power supply terminals, respectively, of chip capacitors 273.

The respective ground pads 271 are connected via the first layer electrode 241 of the layered capacitor portion 240 to the negative electrode of an external power supply and the respective power supply pads 272 are connected via the second layer electrode 242 to the positive electrode of the external power supply. In the present example, ground pads 261 and power supply pads 262 respectively correspond to being the first pads and the second pads, and via holes 261b and via holes 262c respectively correspond to being the first rod terminals and the second rod terminals.

The respective ground pads 271 are connected via the first layer electrode 241 of the layered capacitor portion 240 to the negative electrode of an external power supply and the respective power supply pads 272 are connected via the second layer electrode 242 to the positive electrode of the external power supply. In the present example, ground pads 261 and power supply pads 262 respectively correspond to being the first pads and the second pads, and via holes 261a, 261b, via holes 262a and 262b respectively correspond to being the first rod terminals and the second rod terminals.

Figure 14:
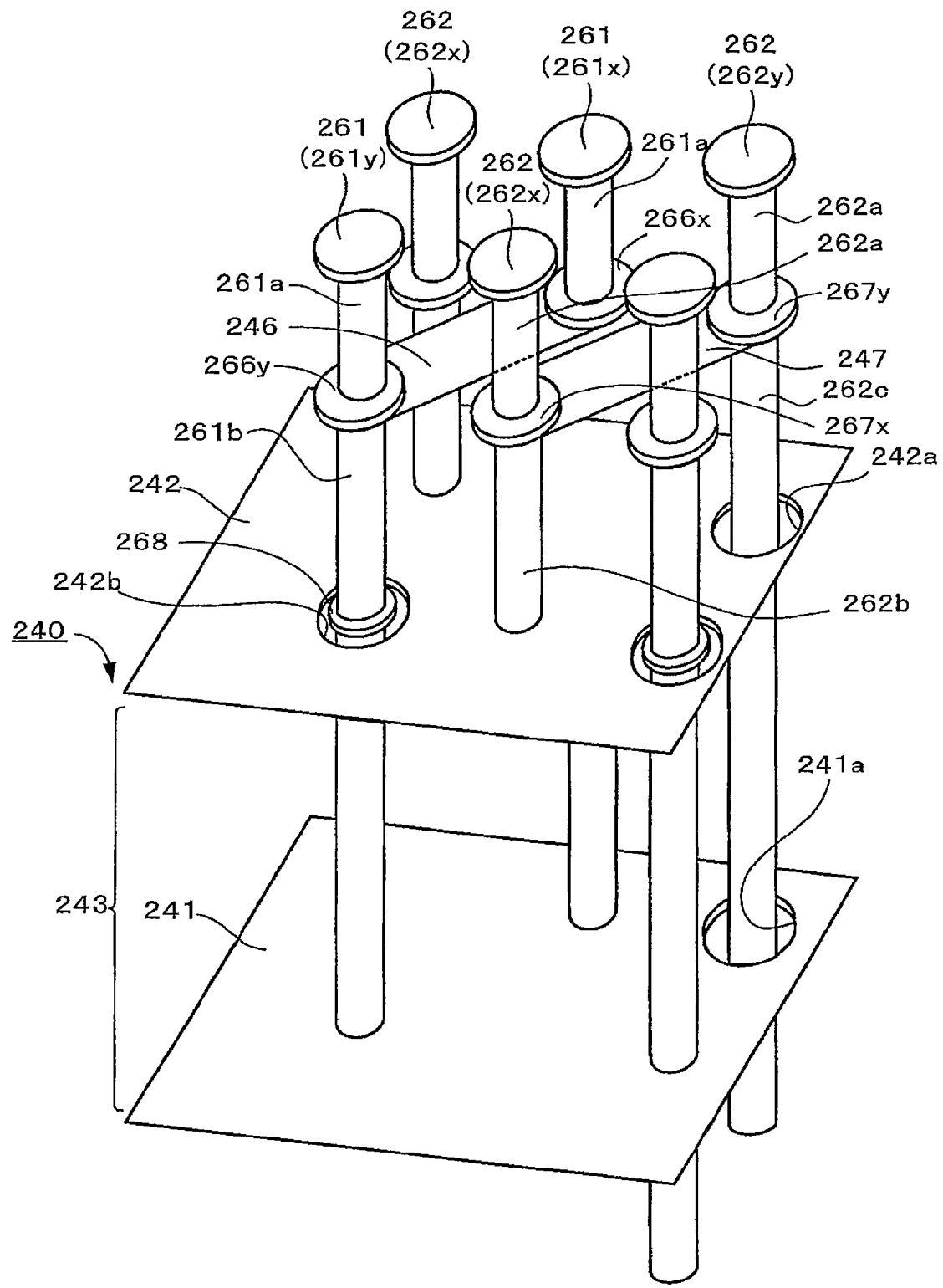
FIG. 14 is a schematic perspective view of a layered capacitor portion 240.
Figure 15:
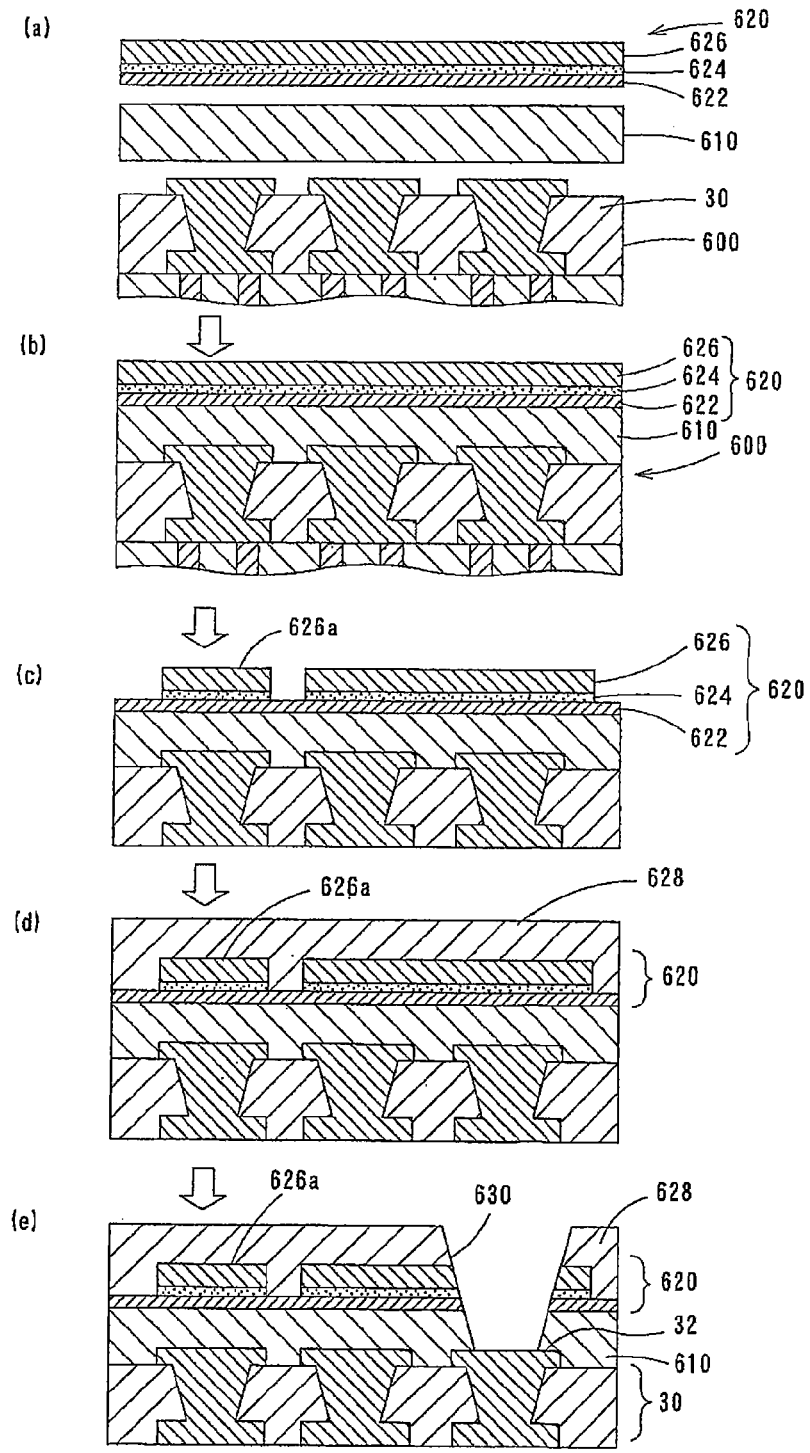
FIG. 15 is an explanatory diagram of a process for manufacturing the multilayer printed wiring board 210.
Figure 16:
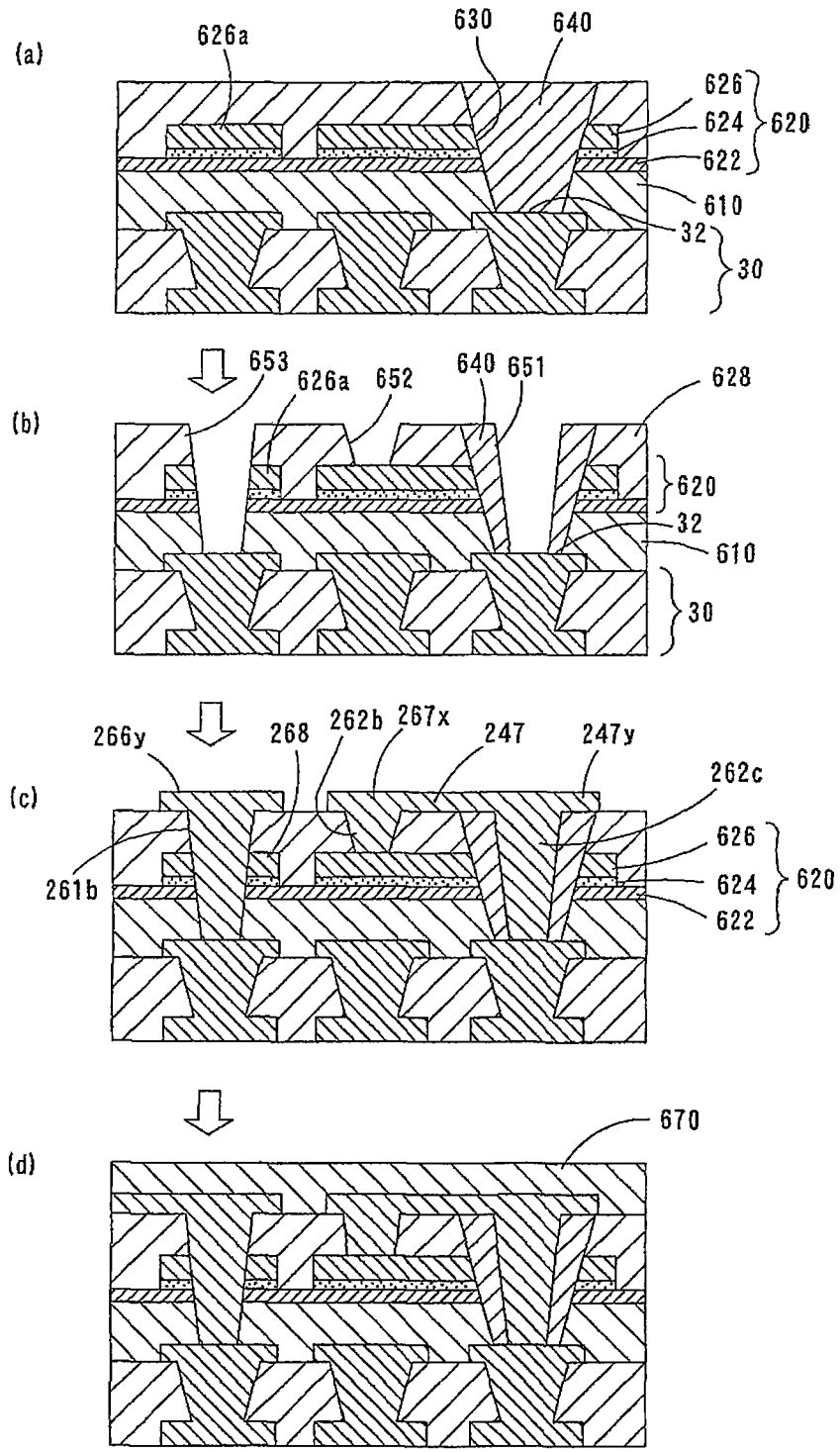
FIG. 16 is an explanatory diagram of a process for manufacturing the multilayer printed wiring board 210.
Figure 17:
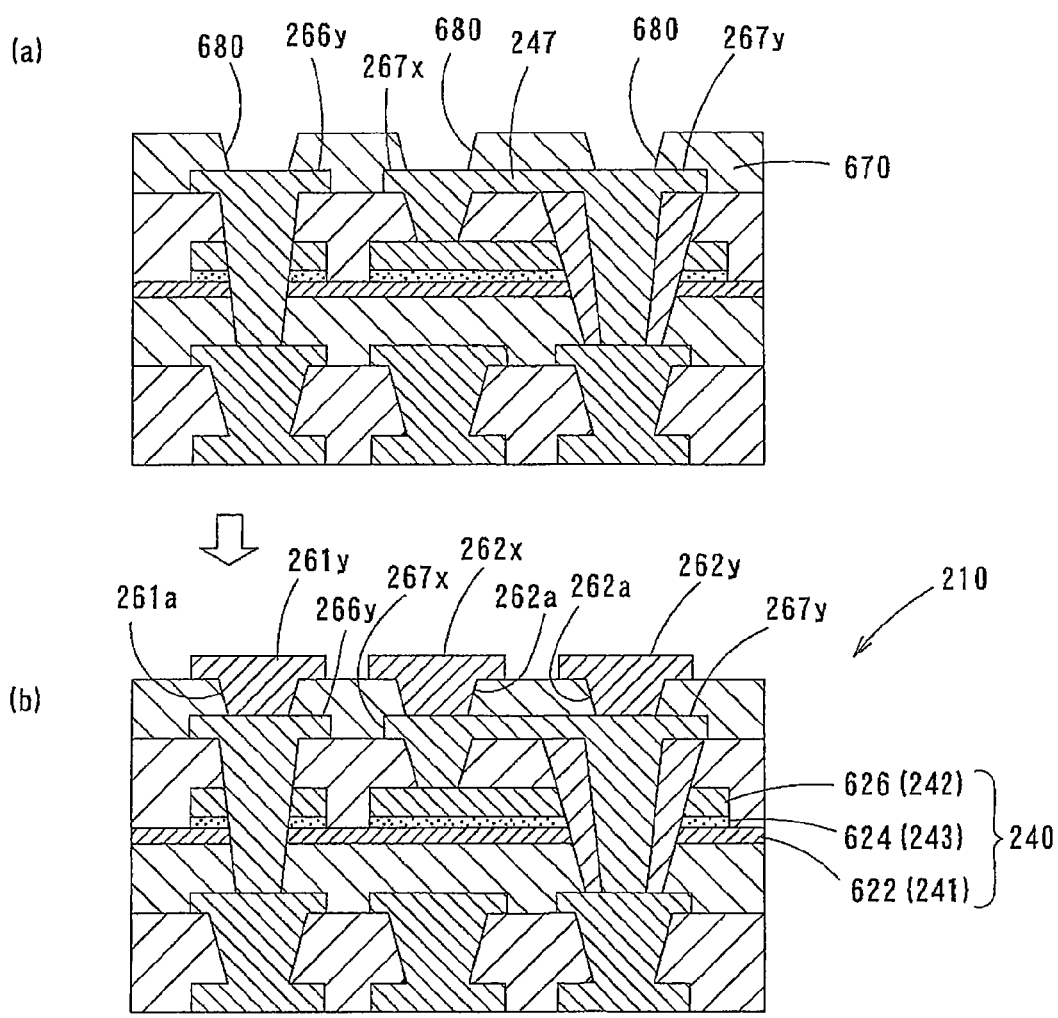
FIG. 17 is an explanatory diagram of a process for manufacturing the multilayer printed wiring board 210.

The procedures for manufacturing the multilayer printed wiring board 210 of the present example shall now be described with reference to FIGS. 15 to 17. FIGS. 13 and 14 are sections taken by cutting a portion below the semiconductor element, that is, the portion below the die where power supply pads 261 and ground pads 262 are aligned alternatingly in a lattice-like or zigzag manner, and FIGS. 15 and 17 are sections taken by cutting at a portion where power supply pads 261 and ground pads 262 are not aligned alternatingly.

First, as shown in FIG. 15A, a substrate 600 having the build-up portion 30 formed at least on one surface of the core substrate 20 was prepared and using a vacuum laminator, an interlayer insulating layer 610 (a thermosetting insulating film; ABF-45SH, made by AJINOMOTO Co., Inc.) was adhered onto the build-up portion 30 under lamination conditions of a temperature of 50 to 150° C. and a pressure of 0.5 to 1.5 MPa. A high dielectric constant sheet 620 (the preparation procedures of which are the same as those of the high dielectric constant sheet 520 of Example 2), which had been prepared in advance, was then adhered using a vacuum laminator onto the interlayer insulating layer 610 (to become interlayer insulating layer 220 of FIG. 13) under lamination conditions of a temperature of 50 to 150° C. and a pressure of 0.5 to 1.5 MPa, and drying at 150° C. was then carried out for 1 hour (see FIG. 15B). The copper foils 622 and 626 of the high dielectric constant sheet 620 were both arranged as solid layers without circuits formed therein. The high dielectric constant sheet 620 was then etched by the tenting method. Though a cupric chloride etching solution was used in the etching process, the process was carried out in a short time so that after etching the copper foil 626 and high dielectric layer 624, copper foil 622 was etched only slightly (see FIG. 15C). In FIG. 15C, portions of the copper foil 626 were separated by etching to form the isolated lands 626a (to become lands 268 of FIG. 13). Thereafter, an interlayer insulating layer (to become the interlayer insulating layer 245; thermosetting insulating film; ABF-45SH made by AJINOMOTO Co., Inc.) 628 was laminated onto high dielectric constant sheet 620 (FIG. 15D). The through holes 630 were then formed by means of a carbon dioxide gas laser, UV laser, YAG laser, or excimer laser, etc., at predetermined positions of the substrate in the middle of preparation on which the interlayer insulating layer 628 had been formed (see FIG. 15E). The through holes 630 were formed to pass through the interlayer insulating layer 628, high dielectric constant sheet 620, and interlayer insulating layer 610 and reach the top surface of the wiring pattern 32 of the build-up portion 30. In regard to the laser conditions, a UV laser made by Hitachi Via Mechanics, Ltd. was used at an output of 3 to 10 W, a frequency of 30 to 60 kHz, and the number of shots was set to 54.

After forming through holes 630, these through holes 630 were filled with a through hole filling resin 640 (the preparation procedures of which are the same as the through hole filling resin 532 of Example 2) and then dried (see FIG. 16A). Through holes 651, 652, and 653 were then formed by means of a carbon dioxide gas laser, UV laser, YAG laser, or excimer laser, etc., at predetermined positions of the substrate in the middle of preparation (see FIG. 16B). Through holes 651 were formed to pass through the through hole filling resin 640 and reach the top surface of the wiring pattern 32 of the build-up portion 30, through holes 652 were formed to pass through the interlayer insulating layer 628 and reach the top surface of the copper foil 626, and through holes 653 were formed to pass through the interlayer insulating layer 628, high dielectric constant sheet 620 (the lands 626a, high dielectric constant layer 624, and copper foil 622), and the interlayer insulating layer 610 and reach the top surface of the wiring pattern 32 of the build-up portion 30. The forming of these through holes 651, 652, and 653 was performed in the order of through holes 651 and then through holes 652 and 653. The depths of the through holes were adjusted by changing the laser type and the number of laser shots. For example, through holes 651 were formed using a $CO_2$ laser via a mask diameter of 1.4 mmφ at conditions of an energy density of 2.0 mj and 3 shots, through holes 652 were formed under the same conditions with the exception of the number of shots being 1, and through holes 653 were formed under the same conditions with the exception of using a UV laser and the number of shots being 56 (output: 3 to 10 W; frequency: 30 to 60 kHz). Through holes 630 were formed not in correspondence to all power supply pads 262 shown in FIG. 13 but in correspondence to a portion, that is, power supply pads 262y, and through holes 653 were formed not in correspondence to all ground pads 261 shown in FIG. 13 but in correspondence to a portion, that is, ground pads 261y.

Thereafter, complete curing was carried out by drying and curing at 170° C. for 3 hours. A catalyst was then added to the top surface of the substrate, a normal semi-additive method was applied to respectively fill through holes 651, 652, and 653 with metal, thereby forming via holes 262c, 262b, and 261b and forming lands 267y, 267x, and 266y on the upper surfaces of these via holes 262c, 262b, and 261b, and furthermore, wiring 247, connecting lands 267x and lands 267y were also formed (see FIG. 16C). By this wiring 247, the wiring pattern 32 of the build-up portion 30 and copper foil 626 (to become the second layer electrode 242) become connected. Also, though omitted from illustration here, lands 266x and wirings 246 of FIG. 14 were formed at the same time. A stress relaxing sheet 670 (to become the stress relaxing portion 250; refer to the stress relaxing sheet 550 of Example 2 in regard to the preparation procedures) was then laminated (see FIG. 16D).

The through holes 680 were then formed at positions of stress relaxing sheet 670 immediately above the respective lands 267y, 267x, and 266y (see FIG. 17A) and by applying roughening, complete curing, catalyst addition, chemical copper plating, plating resist formation, electrical copper plating, plating resist removal, and quick etching, the respective through holes 680 were filled with metal and pads were formed on the upper surfaces of the filling metal (see FIG. 17B). Via holes 262a and power supply pads 262y were thereby formed on lands 267y, via holes 262a and power supply pads 262x were formed on lands 267x, and via holes 261a and ground pads 261y were formed on lands 266y. Also, though omitted from illustration here, via holes 261a and ground pads 261x were formed on lands 266x of FIGS. 13 and 14. The multilayer printed wiring board 210 of FIG. 13 was thus obtained. The copper foil 622 corresponds to being the first layer electrode 241, the copper foil 626 corresponds to being the second layer electrode 242, the high dielectric constant layer 624 corresponds to being the high dielectric constant layer 243, and these make up the layered capacitor portion 240. In Example 3, if ground pads 261x are connected at any of the layers (for example, the mounting portion 260) to ground pads 261y, via holes 261a and lands 266x are unnecessary. Likewise, if power supply pads 262x are connected at any of the layers (for example, the mounting portion 260) to power supply pads 262y, via holes 262a and lands 267x, below power supply pads 262x, and via holes 262b are unnecessary. Via holes and lands can thus be reduced.

Solder bumps may thereafter be formed on the respective terminals of mounting portion 260 (refer to Example 1 concerning the method of forming). If a chip capacitor 273 is to be mounted as shown in FIG. 13, pads 271 and 272 are formed in the same manner as in Example 2.

In the multilayer printed wiring board 110 described in detail above, the same effects as Example 1 described above can be obtained. In addition, with the present Example, since charges from an external power supply source are charged in the high dielectric constant sheet 620 from the build-up portion 30 and through via holes 262c and 262b, without being detoured around the layered capacitor portion 240, and the lengths of wirings connecting the external power supply source to the second layer electrode 242, which is the power supply electrode of the layered capacitor portion 240, and to the first layer electrode 241, which is the ground electrode of the layered capacitor portion 240, are thus made short, the layered capacitor portion 240 will not likely to be short of charges even when a semiconductor element (IC) that is driven at high speed is mounted onto the mounting portion 260.

With the present Example, the opposing area S of the first layer electrode 241 and the second layer electrode 242 was determined so that the static capacitance C of the layered capacitor portion 240 will be 0.5 µF below the die, and based on this opposing area S, the number and positions of the passage holes 241a of the first layer electrode 241 and the number and positions of the passage holes 242a and 242b of the second layer electrode 242 were determined. Here, the opposing area S was computed from $C = \epsilon_0 \cdot \epsilon_r \cdot d / S$. That is, since the relative permittivity $\epsilon_r$ of the high dielectric constant layer 242 is 1850 and the thickness d thereof is 1.2 µm, by substituting these values in the above equation and substituting 0.5 µF as the static capacitance C, the opposing area S was computed. $\epsilon_0$ is the permittivity of vacuum (constant).

Figure 18:
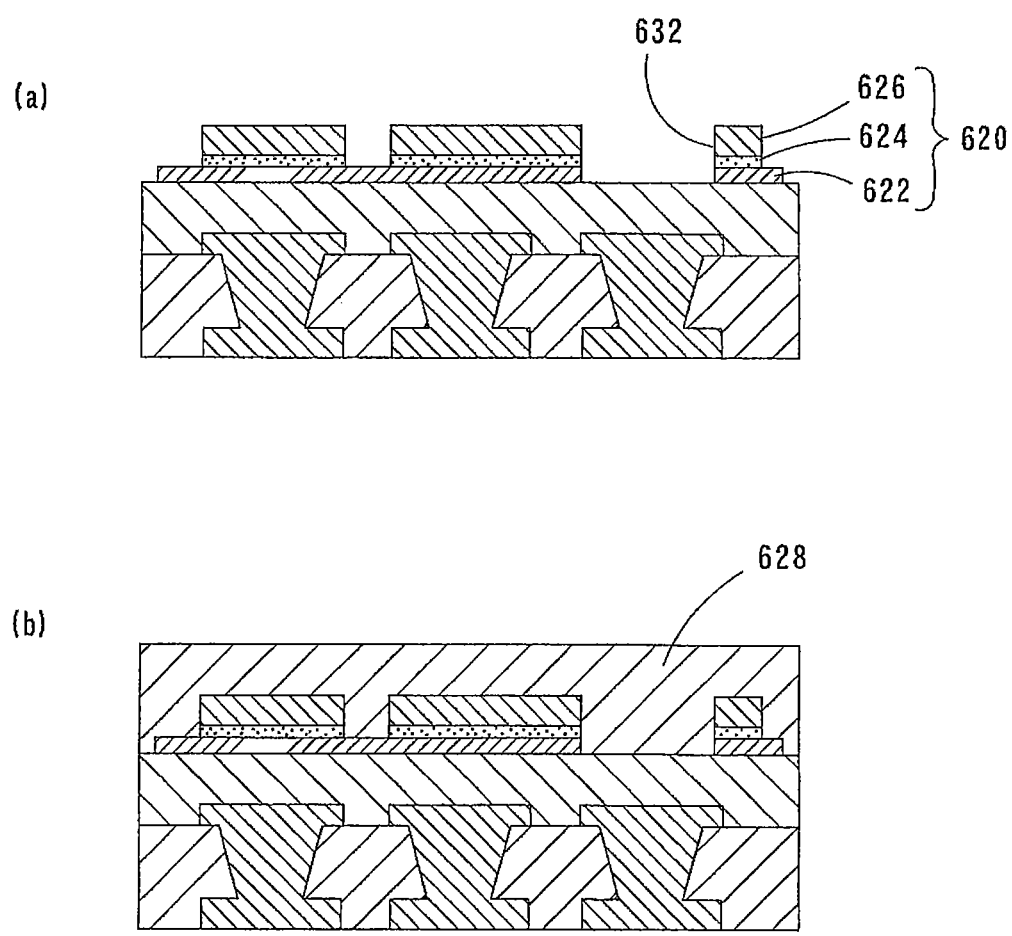
FIG. 18 an explanatory diagram of a manufacturing process of another multilayer printed wiring board 210.

In the above-described manufacturing procedures, the interlayer insulating layer 628 was laminated after the step of FIG. 15C (see FIG. 15D), through holes 630 were formed at predetermined positions of interlayer insulating layer 628 (see FIG. 15E), and after filling through holes 630 with through hole filling resin 640 and drying (see FIG. 16A), through holes 651 were formed in the through hole filling resin 640 (see FIG. 16B). The following may be carried out instead of these steps. That is, after the step of FIG. 15C, a commercially available dry film is adhered onto the top surface of the substrate, portions of high dielectric constant sheet 620, at positions where via holes 262c (see FIG. 16C) are to be formed, are removed by etching at sizes greater than via holes 262c by the tenting method to form enlarged holes 632 (see FIG. 18A), and the interlayer insulating layer 628 is then laminated onto the high dielectric constant sheet 620 so that the interlayer insulating layer 628 is made to fill enlarged holes 632, which had been formed by etching removal priorly, and thereafter dried (FIG. 18B). The steps of Example 3 from the step of forming through holes 651, 652, and 653 onward may then be applied. The step of filling through holes 630 can thereby be eliminated.

Example 4

In Example 2, all of through holes 530 and through holes 531 were formed at positions corresponding to the power supply pads and the ground pads. As a result, the static capacitance of the layered capacitor portion became 0.4 µF.

Example 5

In Example 3, all of through holes 630 and through holes 653 were formed at positions corresponding to the power supply pads and the ground pads. As a result, the static capacitance of the layered capacitor portion became 0.4 µF.

Example 6

In Example 2, the number of times of repetition of spin coating, drying, and calcining of preparation procedure (4) of the high dielectric constant sheet was changed to 20 and a high dielectric constant layer of 0.6 µm was thereby obtained. Besides this, the same procedures as those of Example 2 were carried out. As a result, the static capacitance of the layered capacitor portion below the die became 1.0 µF.

Example 7

In Example 3, the number of times of repetition of spin coating, drying, and calcining of preparation procedure (4) of the high dielectric constant sheet was changed to 20 and a high dielectric constant layer of 0.6 µm was thereby obtained. Besides this, the same procedures as those of Example 3 were carried out. As a result, the static capacitance of the layered capacitor portion below the die became 1.0 µF.

Example 8

In Example 2, the number of times of repetition of spin coating, drying, and calcining of preparation procedure (4) of the high dielectric constant sheet was changed to 1 and a high dielectric constant layer of 0.03 µm was thereby obtained. Besides this, the same procedures as those of Example 2 were carried out. As a result, the static capacitance of the layered capacitor portion below the die became 20 µF.

Example 9

In Example 3, the number of times of repetition of spin coating, drying, and calcining of preparation procedure (4) of the high dielectric constant sheet was changed to 1 and a high dielectric constant layer of 0.03 µm was thereby obtained. Besides this, the same procedures as those of Example 3 were carried out. As a result, the static capacitance of the layered capacitor portion below the die became 20 µF.

Example 10

In Example 2, the number of times of repetition of spin coating, drying, and calcining of preparation procedure (4) of the high dielectric constant sheet was changed to 4 and a high dielectric constant layer of 0.12 µm was thereby obtained. Besides this, the same procedures as those of Example 2 were carried out. As a result, the static capacitance of the layered capacitor portion below the die became 5 µF.

Example 11

In Example 3, the number of times of repetition of spin coating, drying, and calcining of preparation procedure (4) of the high dielectric constant sheet was changed to 4 and a high dielectric constant layer of 0.12 µm was thereby obtained. Besides this, the same procedures as those of Example 3 were carried out. As a result, the static capacitance of the layered capacitor portion below the die became 5 µF.

Example 12

In Example 2, the number of times of repetition of spin coating, drying, and calcining of preparation procedure (4) of the high dielectric constant sheet was changed to 2 and a high dielectric constant layer of 0.06 µm was thereby obtained. Besides this, the same procedures as those of Example 2 were carried out. As a result, the static capacitance below the die became 10 µF.

Example 13

In Example 3, the number of times of repetition of spin coating, drying, and calcining of preparation procedure (4) of the high dielectric constant sheet was changed to 2 and a high dielectric constant layer of 0.06 µm was thereby obtained. Besides this, the same procedures as those of Example 3 were carried out. As a result, the static capacitance below the die became 10 µF.

Example 14

In Example 8, all of through holes 530 and through holes 531 were formed at positions corresponding to the power supply pads and the ground pads. As a result, the static capacitance became 16 µF.

Example 15

In Example 9, all of through holes 630 and through holes 653 were formed at positions corresponding to the power supply pads and the ground pads. As a result, the static capacitance became 16 µF.

Example 16

In Example 2, the number of times of repetition of spin coating, drying, and calcining of preparation procedure (4) of the high dielectric constant sheet was changed to 330 and a high dielectric constant layer of 10 µm was thereby obtained. Besides this, the same procedures as those of Example 2 were carried out. As a result, the static capacitance below the die became 0.06 µF.

Example 17

In Example 3, the number of times of repetition of spin coating, drying, and calcining of preparation procedure (4) of the high dielectric constant sheet was changed to 330 and a high dielectric constant layer of 10 µm was thereby obtained. Besides this, the same procedures as those of Example 3 were carried out. As a result, the static capacitance below the die became 0.06 µF.

Example 18

In Example 2, the number of times of repetition of spin coating, drying, and calcining of preparation procedure (4) of the high dielectric constant sheet was changed to 10 and a high dielectric constant layer of 0.3 µm was thereby obtained. Besides this, the same procedures as those of Example 2 were carried out. As a result, the static capacitance below the die became 2.0 µF.

Example 19

In Example 3, the number of times of repetition of spin coating, drying, and calcining of preparation procedure (4) of the high dielectric constant sheet was changed to 10 and a high dielectric constant layer of 0.3 μm was thereby obtained. Besides this, the same procedures as those of Example 3 were carried out. As a result, the static capacitance below the die became 2.0 μF.

Example 20

In Example 2, the number of times of repetition of spin coating, drying, and calcining of preparation procedure (4) of the high dielectric constant sheet was changed to 25 and a high dielectric constant layer of 0.75 μm was thereby obtained. Besides this, the same procedures as those of Example 2 were carried out. As a result, the static capacitance below the die became 0.8 μF.

Example 21

In Example 3, the number of times of repetition of spin coating, drying, and calcining of preparation procedure (4) of the high dielectric constant sheet was changed to 25 and a high dielectric constant layer of 0.75 μm was thereby obtained. Besides this, the same procedures as those of Example 3 were carried out. As a result, the static capacitance below the die became 0.8 μF.

Example 22

In Example 3, the high dielectric constant sheet was subject to an etching process in advance and portions of the copper foil 626 and high dielectric constant layer 624 were removed. Thereafter, the high dielectric constant sheet was adhered via the interlayer insulating layer 610 onto a substrate 600 having the build-up portion 30 formed thereon. That is, the high dielectric constant sheet adhesion step and the high dielectric constant sheet etching step of Example 3 were interchanged. The subsequent steps were the same as those of Example 3.

Example 23

A chip capacitor was mounted onto the multilayer printed wiring board of Example 4.

Example 23

A chip capacitor was mounted onto the multilayer printed wiring board of Example 5.

Example 25

In Example 2, the interlayer insulating layer 510 (see FIG. 9A) was used in place of the stress relaxing portion 150. Besides this, the same procedures as those of Example 2 were carried out.

Example 26

In Example 3, the interlayer insulating layer 610 (see FIG. 15A) was used in place of the stress relaxing portion 250. Besides this, the same procedures as those of Example 3 were carried out.

Examples 27 to 49

The multilayer printed wiring boards were manufactured using an interlayer insulating layer in place of the stress relaxing portion in each of Examples 2 to 24, and were respectively indicated as Examples 27 to 49.

Comparative Example

A high dielectric constant sheet of a comparative example was prepared based on the preparation procedures of the other form of the high dielectric constant sheet described in Example 2. However, calcining was not performed and electrodes were formed on an uncalcined layer after drying. Besides this, the same procedures as those of Example 2 were carried out. As a result, the static capacitance below the die became less than 0.001 μF.

[Evaluation Test 1]

An IC chip with a drive frequency of 3.6 GHZ and an FSB of 1066 MHz was mounted onto the multilayer printed circuit board of each of Examples 2 to 49, simultaneous switching was repeated 100 times, and whether or not erroneous operation occurred was checked using a pulse pattern generator/error detector (trade name: D3186/3286; made by ADVANTEST CORPORATION.).

[Evaluation Test 2: HAST]

The multilayer printed circuit board of each of Examples 2 to 49 was placed in an environmental tester set to 85° C.×85% for a total of 50 hours while applying a voltage of 3.3V across the first layer electrode and the second layer electrode. Discharge was carried out every 2 hours during this time. Thereafter, an IC chip with a drive frequency of 3.6 GHZ and an FSB of 1066 MHz was mounted, simultaneous switching was repeated 100 times, and whether or not erroneous operation occurred was checked using the above-described pulse pattern generator/error detector.

[Evaluation Test 3: HAST]

Each multilayer printed circuit board, which had been subject to Evaluation Test 2, was placed in an environmental tester set to 85° C.×85% for a total of 50 hours while applying a voltage of 3.3V across the first layer electrode and the second layer electrode as in Evaluation Test 2. Discharge was carried out every 2 hours during this time. Thereafter, an IC chip with a drive frequency of 3.6 GHZ and an FSB of 1066 MHz was mounted, simultaneous switching was repeated 100 times, and whether or not erroneous operation occurred was checked using the above-described pulse pattern generator/error detector.

[Evaluation Test 4: Heat Cycle]

The following heat cycle test was carried out on the multilayer printed circuit board of each of Examples 2 to 26. Heat cycle test conditions: A cycle of −55° C.×30 minutes and 125° C.×30 minutes was repeated 100 times or 500 times. Thereafter, an IC chip with a drive frequency of 3.6 GHZ and an FSB of 1066 MHz was mounted, simultaneous switching was repeated 100 times, and whether or not erroneous operation occurred was checked using the above-described pulse pattern generator/error detector.

[Evaluation Test 5]

In place of the IC chip with a drive frequency of 3.6 GHZ and an FSB of 1066 MHz of Evaluation Test 1, an IC chip with a drive frequency of 5.7 GHZ and an FSB of 1066 MHz was mounted and the same test as Evaluation Test 1 was conducted. As a result, erroneous operation did not occur with multilayer printed wiring boards, with which the static capacitance below the die is not less than 1.0 μF.

[Evaluation Results]

The results of Evaluation Tests 1 to 4 are shown in Table 1. In table 1, a ○ indicates that erroneous operation was not observed and a x indicates that erroneous operation was observed. The static capacitance below the die and the evaluation results of Evaluation Tests 1 to 3 for Examples 27 to 49 were the same as those of Examples 2 to 24, respectively, though not shown in Table 1.

TABLE 1

|  |  | μ | μ |  | Evaluation test results |  |  |  |  |
|---|---|---|---|---|---|---|---|---|---|
|  |  |  |  |  | 1 | 2 | 3 | 4*2 | 4*3 |
| Example 2 | Partial | 1.2 | 0.5 | Not mounted | o | o | x | o | x |
| Example 3 | Partial | 1.2 | 0.5 | Not mounted | o | o | x | o | x |
| Example 4 | All | 1.2 | 0.4 | Not mounted | o | x | x | o | x |
| Example 5 | All | 1.2 | 0.4 | Not mounted | o | x | x | o | x |
| Example 6 | Partial | 0.6 | 1.0 | Not mounted | o | o | o | o | o |
| Example 7 | Partial | 0.6 | 1.0 | Not mounted | o | o | o | o | o |
| Example 8 | Partial | 0.03 | 20 | Not mounted | o | — | — | o | x |
| Example 9 | Partial | 0.03 | 20 | Not mounted | o | — | — | o | x |
| Example 10 | Partial | 0.12 | 5 | Not mounted | o | o | o | o | o |
| Example 11 | Partial | 0.12 | 5 | Not mounted | o | o | o | o | o |
| Example 12 | Partial | 0.06 | 10 | Not mounted | o | o | x | o | x |
| Example 13 | Partial | 0.06 | 10 | Not mounted | o | o | x | o | x |
| Example 14 | All | 0.03 | 16 | Not mounted | o | x | x | o | x |
| Example 15 | All | 0.03 | 16 | Not mounted | o | x | x | o | x |
| Example 16 | Partial | 10 | 0.06 | Not mounted | o | x | x | o | x |
| Example 17 | Partial | 10 | 0.06 | Not mounted | o | x | x | o | x |
| Example 18 | Partial | 0.3 | 2.0 | Not mounted | o | o | o | o | o |
| Example 19 | Partial | 0.3 | 2.0 | Not mounted | o | o | o | o | o |
| Example 20 | Partial | 0.75 | 0.8 | Not mounted | o | o | o | o | o |
| Example 21 | Partial | 0.75 | 0.8 | Not mounted | o | o | o | o | o |
| Example 22 | Partial | 1.2 | 0.3 | Not mounted | o | — | — | o | x |
| Example 23 | All | 1.2 | 0.4 | Mounted | o | o | o | o | o |
| Example 24 | All | 1.2 | 0.4 | Mounted | o | o | o | o | o |
| Example 25 | Partial | 1.2 | 0.5 | Not mounted | o | — | — | o | x |
| Example 26 | Partial | 1.2 | 0.5 | Not mounted | o | — | — | o | x |
| Comparative Example 1 | Partial | 5 | <0.01 | Not mounted | x | — | — | x | — |

*1 C/C = chip capacitor
*2 after 100 cycles
*3 after 500 cycles

The results of Evaluation Test 1 show that by using a high dielectric constant material, which has been calcined apart from the build-up portion and thereby made into a ceramic, as the high dielectric constant layer, the dielectric constant can be adequately high and instantaneous drops of electrical potential can thereby be restrained.

Also, the results of Evaluation Test 4 show that the Comparative Example cannot accommodate for instantaneous potential drops of the IC chip after 100 cycles. Though the cause is not clear, it is presumed that due to the weak joining of high dielectric constant particles, cracks develop and lead to loss of capacitor functions.

Also Example 22, in which a circuit is formed on the high dielectric constant sheet prior to adhesion onto the build-up portion, cannot accommodate for instantaneous potential drops of the IC chip after being subject to the heat cycle test. Though the cause is not clear, it is presumed that due to the heat cycle test, cracks developed from portions at which the pressure concentrates in the lamination process.

Examples 25 and 26 that do not have stress relaxing portions also cannot accommodate for instantaneous potential drops of the IC chip after being subject to the heat cycle test. Though the cause is not clear, it is presumed that since the stress relaxing portion is not provided, cracks or starting points of cracks were formed in the high dielectric constant layer due to stress resulting from the thermal expansion coefficient difference between the IC chip and the multilayer printed wiring board. It is considered that when starting points of cracks are formed in the heat cycle test, the repeated charging and discharging of the high dielectric constant layer in the simultaneous switching test lead to the forming of cracks due to the displacement of particles in this process.

Furthermore, Examples 4 and 5, in which the static capacitance below the die is not more than 0.4 μF, cannot accommodate for instantaneous potential drops of the IC chip after being subject to Evaluation Test 2. Though the cause is not clear, it is presumed that due to the HAST test, the high dielectric constant layer became degraded, lowered in relative permittivity, and thereby unable to exhibit an adequate decoupling effect. Also, whereas when the static capacitance below the die becomes not more than 0.5 μF, instantaneous potential drops of the IC chip cannot be accommodated after Evaluation Test 2, problems did not occur with Examples 23 and having the same static capacitances below the die as Examples 4 and 5. Though the cause is not clear, it is presumed that instantaneous potential drops of the IC chip are accommodated by the additional supply of power from the chip capacitor. Furthermore, even with Examples 14 and 15, which are high in static capacitance, instantaneous potential drops of the IC chip cannot be accommodated after Evaluation Test 2. Though the cause is not clear, it is presumed that due to the high static capacitance, the influence of the HAST test is received more readily and the high dielectric layers thus underwent dielectric degradation or dielectric breakdown.

In Examples 12 to 15 with high static capacitance, the results of Evaluation Test 4*3 are x. It is presumed that since with a dielectric material, crystal displacement occurs when charging and discharging are repeated and stress accumulated in the heat cycle is added to this stress due to displacement, the relative permittivity of the high dielectric constant layer degrades, thus leading to x results. The results of Evaluation Test 4*3 are also x for Examples 2 to 5, 16, and 17, which are comparatively low in static capacitance. This is presumed to be due to the relative permittivity of the high dielectric constant becoming degraded by expansion and contraction of the dielectric material in the heat cycle test and causing the static capacitance below the die to decrease, thus leading to x results.

The results of Table 1 show that when the static capacitance below the die is 0.8 to 5 μF, instantaneous voltage drops of the transistor of the IC can be accommodated even after an environment test and since problems do not occur even after conducting an HAST test or a heat cycle test, the insulation reliability and the connection reliability are extremely high.

Though in all of the Examples, the first layer electrode was used for ground and the second layer electrode was used for power supply, this relationship may be reversed.

The multilayer printed wiring board of the present invention is used for mounting an IC chip or other semiconductor element and can be used, for example, for electric-related industries and communication-related industries.

What is claimed is:

1. A method for manufacturing a printed wiring board, comprising:
   forming an uncalcined layer comprising a raw ceramic material on a first metal layer;
   firing the uncalcined layer formed on the first metal layer such that a high dielectric constant layer comprising a ceramic body calcined in a sheet form is formed on the first metal layer;
   forming a second metal layer on the high dielectric constant layer on an opposite side of the high dielectric constant layer with respect to the first metal layer such that a layered capacitor comprising the high dielectric constant layer and first and second layer electrodes sandwiching the high dielectric constant layer is formed; and
   disposing the layered capacitor in a main body.

2. The method for manufacturing a printed wiring board according to claim 1, wherein the main body is formed to have a build-up portion comprising a resin insulating layer, and the disposing of the layered capacitor comprises positioning the layered capacitor on the resin insulating layer of the build-up portion in the main body.

3. The method for manufacturing a printed wiring board according to claim 2, wherein the main body further comprises a resin core substrate, wherein the build-up portion is formed on the resin core substrate.

4. The method for manufacturing a printed wiring board according to claim 2, wherein the resin insulating layer of the main body comprises one of a BT resin and a epoxy resin.

5. The method for manufacturing a printed wiring board according to claim 1, wherein the main body is formed to have a mounting portion on a surface and a plurality of ground pads and a plurality of power supply pads in the mounting portion, the ground pads are formed to be positioned such that a ground line of a semiconductor device is connected to one of the ground pads, the power supply pads are formed to be positioned such that a power supply line of the semiconductor device is connected to one of the power supply pads, and the disposing of the layered capacitor comprises connecting one of the first and second layer electrodes to the power supply line of the semiconductor device and the other one of the first and second layer electrodes to the ground line of the semiconductor device, forming the first layer electrode having a solid pattern including a plurality of passage holes through which a plurality of second rod terminals connecting to the second layer electrode pass in a non-contacting manner, and forming the second layer electrode having a solid pattern including a plurality of passage holes through which a plurality of first rod terminals connecting to the first layer electrode pass in a non-contacting manner.

6. The method for manufacturing a printed wiring board according to claim 5, wherein the mounting of the layered capacitor comprises connecting the first layer electrode such that the plurality of power supply pads includes ones having a same potential as the first layer electrode, being connected to the first rod terminals passing through the second layer electrode in a non-contacting manner and being electrically connected via the first rod terminals to the first layer electrode and a negative electrode of an external power supply, and connecting the second layer electrode such that the plurality of power supply pads includes ones having a same potential as the second layer electrode, being connected to the second rod terminals passing through the first layer electrode in a non-contacting manner and being electrically connected via the second rod terminals to the second layer electrode and a positive electrode of the external power supply.

7. The method for manufacturing a printed wiring board according to claim 1, wherein the first rod terminals and the second rod terminals are formed to be aligned at least partially alternating in a lattice-like or zigzag manner.

8. The method for manufacturing a printed wiring board according to claim 1, wherein the main body is formed to have a mounting portion on a surface and a plurality of ground pads and a plurality of power supply pads in the mounting portion, the ground pads are formed to be positioned such that a ground line of a semiconductor device is connected to one of the ground pads, the power supply pads are formed to be positioned such that a power supply line of the semiconductor device is connected to one of the power supply pads, the main body is formed to have a build-up portion comprising a resin insulating layer, the disposing of the layered capacitor comprises positioning the layered capacitor on the resin insulating layer of the build-up portion, connecting one of the first and second layer electrodes to the power supply line of the semiconductor device and the other one of the first and second layer electrodes to the ground line of the semiconductor device, forming the first layer electrode having a solid pattern including a plurality of passage holes through which a plurality of second rod terminals connected to the second layer electrode pass in a non-contacting manner, forming the second layer electrode having a solid pattern including a plurality of passage holes through which a plurality of first rod terminals connected to the first layer electrode pass in a non-contacting manner, forming at least one of the first and second layer electrodes comprising a plating film formed on at least one of the first and second metal layers, and forming at least one of the plurality of first rod terminals and the plurality of second rod terminals comprising a plating film.

9. The method for manufacturing a printed wiring board according to claim 8, wherein the disposing of the layered capacitor comprises connecting the first layer electrode such that the plurality of ground pads includes ones having a same potential as the first layer electrode, being connected to the first rod terminals passing through the second layer electrode in a non-contacting manner and being electrically connected via the first rod terminals to the first layer electrode and a negative electrode of an external power supply, and connecting the second layer electrode such that the plurality of power supply pads includes ones having a same potential as the second layer electrode, being connected to the second rod terminals passing through the first layer electrode in a non-contacting manner and being electrically connected via the second rod terminals to the second layer electrode and a positive electrode of the external power supply.

10. The method for manufacturing a printed wiring board according to claim 8, wherein the plating film of the at least one of the first and second layer electrodes comprises an electrolytic plating film, and the plating film of the at least one of the plurality of first rod terminals and the plurality of second rod terminals comprises an electrolytic plating film.

11. The method for manufacturing a printed wiring board according to claim 8, wherein the plating film of the at least one of the first and second layer electrodes and the plating film of the at least one of the plurality of first rod terminals and the plurality of second rod terminals are formed during a same plating process.

12. The method for manufacturing a printed wiring board according to claim 8, wherein the plating film of the at least one of the first and second layer electrodes comprises a copper plating film, and the plating film of the at least one of the plurality of first rod terminals and the plurality of second rod terminals comprises a copper plating film.

13. The method for manufacturing a printed wiring board according to claim 8, wherein the plurality of metal layers of the at least one of the first and second layer electrodes comprises the plating film and the metal layer comprising a metal foil.

14. The method for manufacturing a printed wiring board according to claim 8, wherein one of the first and second layer electrodes comprises the plating film and the metal layer comprising a metal foil, and the other one of the first and second layer electrodes comprises a metal foil.

15. The method for manufacturing a printed wiring board according to claim 1, wherein the forming of the second metal layer comprises sputtering a metal on the high dielectric constant layer, and the first metal layer comprises a metal foil.

16. The method for manufacturing a printed wiring board according to claim 1, wherein the forming of the second metal layer comprises depositing a metal on the high dielectric constant layer, and the first metal layer comprises a metal foil.

17. The method for manufacturing a printed wiring board according to claim 1, wherein the forming of the second metal layer comprises vapor-depositing a metal on the high dielectric constant layer, and the first metal layer comprises a metal foil.

18. The method for manufacturing a printed wiring board according to claim 1, wherein the forming of the uncalcined layer comprises coating the raw ceramic material on the first metal layer.

19. The method for manufacturing a printed wiring board according to claim 1, wherein the forming of the uncalcined layer comprises printing a film comprising the raw ceramic material on the first metal layer and drying the film formed on the first metal layer.

20. The method for manufacturing a printed wiring board according to claim 1, wherein the raw ceramic material comprises at least one metal oxide selected from the group consisting of $BaTiO_3$, $SrTiO_3$, $TaO_3$, $Ta_2O_5$, PZT, PLZT, PNZT, PCZT and PSZT.

* * * * *